(12) United States Patent
Nakajima et al.

(10) Patent No.: US 9,893,641 B2
(45) Date of Patent: Feb. 13, 2018

(54) THREE-PHASE INVERTER MODULE

(71) Applicant: TOYOTA JIDOSHA KABUSHIKI KAISHA, Toyota-shi, Aichi (JP)

(72) Inventors: Kiyofumi Nakajima, Odawara (JP); Yuki Ide, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/304,594

(22) PCT Filed: Apr. 22, 2015

(86) PCT No.: PCT/JP2015/063049
§ 371 (c)(1),
(2) Date: Oct. 17, 2016

(87) PCT Pub. No.: WO2015/170672
PCT Pub. Date: Nov. 12, 2015

(65) Prior Publication Data
US 2017/0085190 A1 Mar. 23, 2017

(30) Foreign Application Priority Data
May 7, 2014 (JP) .................... 2014-095996

(51) Int. Cl.
*H02M 1/00* (2006.01)
*H02M 7/00* (2006.01)
(Continued)

(52) U.S. Cl.
CPC ........ *H02M 7/003* (2013.01); *H01L 23/3107* (2013.01); *H01L 23/3735* (2013.01);
(Continued)

(58) Field of Classification Search
CPC ..................................................... H02M 7/003
(Continued)

(56) References Cited

U.S. PATENT DOCUMENTS 6,525,950 B1    2/2003   Shirakawa et al.
2007/0076355 A1  4/2007   Oohama
(Continued)

FOREIGN PATENT DOCUMENTS

JP    2001-286158 A   10/2001
JP    2007-006575 A    1/2007

OTHER PUBLICATIONS

International Search Report for PCT/JP2015/063049 dated Jul. 22, 2015 [PCT/ISA/210].
(Continued)

*Primary Examiner* — Alex Torres-Rivera
(74) *Attorney, Agent, or Firm* — Sughrue Mion, PLLC

(57) ABSTRACT

In an upper phase module 2, a second electrode terminal 24V is located at a center C1 of the upper phase module 2, and a first electrode terminal 24U and a third electrode terminal 24W, and a first P terminal 25P and a second P terminal 26P are located so as to be symmetric with respect to the second electrode terminal 24V in an X-direction. The first electrode terminal 24U, the second electrode terminal 24V, the third electrode terminal 24W, the first P terminal 25P and the second P terminal 26P of the upper phase module 2 are located at the same positions as those of a fourth electrode terminal 34U, a fifth electrode terminal 34V, a sixth electrode terminal 34W, a first N terminal 35N and a second N terminal 36N of a lower phase module 3, respectively, in the X-direction.

5 Claims, 18 Drawing Sheets

(51) Int. Cl.
*H01L 25/11* (2006.01)
*H01L 23/373* (2006.01)
*H01L 23/495* (2006.01)
*H01L 23/31* (2006.01)
*H01L 25/07* (2006.01)
*H01L 25/18* (2006.01)
*H01L 23/00* (2006.01)

(52) U.S. Cl.
CPC .. *H01L 23/49541* (2013.01); *H01L 23/49555* (2013.01); *H01L 23/49562* (2013.01); *H01L 23/49575* (2013.01); *H01L 24/33* (2013.01); *H01L 25/074* (2013.01); *H01L 25/112* (2013.01); *H01L 25/18* (2013.01); *H01L 24/29* (2013.01); *H01L 24/32* (2013.01); *H01L 2224/291* (2013.01); *H01L 2224/32245* (2013.01); *H01L 2224/33181* (2013.01); *H01L 2224/40137* (2013.01); *H01L 2924/1203* (2013.01); *H01L 2924/13055* (2013.01)

(58) Field of Classification Search
USPC .......................................................... 363/144
See application file for complete search history.

(56) References Cited

U.S. PATENT DOCUMENTS

| | | | |
|---|---|---|---|
| 2008/0290506 A1* | 11/2008 | Aoki | H01L 23/473 257/714 |
| 2011/0156797 A1* | 6/2011 | Ninomiya | H01L 25/112 327/482 |
| 2011/0180809 A1* | 7/2011 | Hino | H01L 23/3121 257/77 |
| 2011/0221268 A1* | 9/2011 | Kanazawa | H05K 1/0263 307/10.1 |
| 2012/0228741 A1 | 9/2012 | Araki et al. | |
| 2013/0258628 A1* | 10/2013 | Kawanami | H01L 25/072 361/783 |
| 2014/0035658 A1* | 2/2014 | Usui | G05F 1/10 327/512 |
| 2015/0131232 A1* | 5/2015 | Ishino | H01L 23/4334 361/707 |
| 2017/0105321 A1* | 4/2017 | Tokuyama | H05K 7/20927 |

OTHER PUBLICATIONS

Written Opinion for PCT/JP2015/063049 dated Jul. 22, 2015 [PCT/ISA/237].

* cited by examiner

THREE-PHASE INVERTER MODULE

CROSS REFERENCE TO RELATED APPLICATIONS

This application is a National Stage of International Application No. PCT/JP2015/063049 filed Apr. 22, 2015, claiming priority based on Japanese Patent Application No. 2014-095996 filed May 7, 2014, the contents of all of which are incorporated herein by reference in their entirety.

TECHNICAL FIELD

The present invention relates to a three-phase inverter module.

BACKGROUND ART

Japanese Unexamined Patent Application Publication No. 2007-006575 discloses a three-phase inverter module in which an upper phase module and a lower phase module are laminated with a cooler interposed therebetween. In the upper phase module, a U terminal protruding from a U-phase U electrode, a V terminal protruding from a V-phase V electrode, a W terminal protruding from a W-phase W electrode, and a P terminal protruding from a P electrode are arranged in this order. In addition, in the lower phase module, a U terminal protruding from a U-phase U electrode, a V terminal protruding from a V-phase V electrode, a W terminal protruding from a W-phase W electrode, and an N terminal protruding from an N electrode are arranged in this order. The P terminal, the U terminal, the V terminal and the W terminal of the upper phase module, and the N terminal, the U terminal, the V terminal and the W terminal of the lower phase module are respectively opposite to each other in a lamination direction between the upper phase module and the lower phase module.

SUMMARY OF INVENTION

Technical Problem

In this manner, in the three-phase inverter module disclosed in Japanese Unexamined Patent Application Publication No. 2007-006575, the upper phase module is provided with the P terminal, the U terminal, the V terminal and the W terminal one by one, and the lower phase module is provided with the N terminal, the U terminal, the V terminal and the W terminal one by one. For this reason, in order to cause the P terminal and the N terminal to be opposite to each other in the lamination direction of the upper phase module and the lower phase module, the position of the P terminal in the upper phase module and the position of the N terminal in the lower phase module are required to be provided at different positions. As a result, a mold for resin-molding the upper phase module and a mold for resin-molding the lower phase module cannot be used in common.

Consequently, the present invention provides a three-phase inverter module which is capable of using a mold for resin-molding an upper phase module and a mold for resin-molding a lower phase module in common.

Solution to Problem

According to an aspect of the present invention, there is provided a three-phase inverter module including an upper phase module and a lower phase module which are opposite to each other, wherein the upper phase module includes a first electrode, a second electrode and a third electrode which are arranged in a first direction perpendicular to an opposite direction between the upper phase module and the lower phase module; a P electrode which is connected to the first electrode, the second electrode and the third electrode through a first semiconductor device portion, a second semiconductor device portion and a third semiconductor device portion, respectively; an upper phase mold portion in which the first electrode, the second electrode, the third electrode and the P electrode are formed integrally with each other; a first electrode terminal that protrudes from the first electrode in a second direction perpendicular to the first direction; a second electrode terminal that protrudes from the second electrode in the second direction; a third electrode terminal that protrudes from the third electrode in the second direction; and a first P terminal and a second P terminal that protrude from the P electrode in the first direction or the second direction, wherein the lower phase module includes a fourth electrode, a fifth electrode and a sixth electrode which are arranged in the first direction; an N electrode which is connected to the fourth electrode, the fifth electrode and the sixth electrode through a fourth semiconductor device portion, a fifth semiconductor device portion and a sixth semiconductor device portion, respectively; a lower phase mold portion in which the fourth electrode, the fifth electrode, the sixth electrode and the N electrode are formed integrally with each other, and which has the same shape as that of the upper phase mold portion; a fourth electrode terminal that protrudes from the fourth electrode in the second direction; a fifth electrode terminal that protrudes from the fifth electrode in the second direction; a sixth electrode terminal that protrudes from the sixth electrode in the second direction; and a first N terminal and a second N terminal that protrude from the N electrode in the first direction or the second direction, wherein the first electrode terminal and the fourth electrode terminal, the second electrode terminal and the fifth electrode terminal, the third electrode terminal and the sixth electrode terminal, the first P terminal and the first N terminal, and the second P terminal and the second N terminal are located at the same positions, respectively, in the first direction, wherein in the respective terminals included in the upper phase module and the respective terminals included in the lower phase module, one terminal of the respective terminals is a central terminal which is located at a center of the upper phase module or the lower phase module in the first direction, a pair of terminals other than the central terminal are a first inside terminal and a second inside terminal that protrude from positions symmetric with respect to the central terminal in the first direction, and from the same position in a third direction perpendicular to the first direction and the second direction, and a remaining pair of terminals are a first outside terminal and a second outside terminal which are located outside a region between the first inside terminal and the second inside terminal in the first direction, and wherein the first outside terminal and the second outside terminal protrude from positions symmetric with respect to the central terminal in the first direction, and from the same position in the third direction.

As an embodiment, the upper phase module and the lower phase module may be laminated with an insulating portion interposed therebetween in the opposite direction.

In addition, as an embodiment, the second electrode terminal may be the central terminal, the first electrode terminal and the third electrode terminal may protrude from positions symmetric with respect to the second electrode terminal in the first direction, and the first P terminal and the second P terminal may protrude from the positions symmetric with respect to the second electrode terminal in the first direction.

In addition, as an embodiment, the first P terminal and the second P terminal may be the first inside terminal and the second inside terminal.

In addition, as an embodiment, the upper phase module may further include a first signal line, connected to the first semiconductor device portion, which protrudes from the upper phase mold portion in the second direction; a second signal line, connected to the second semiconductor device portion, which protrudes from the upper phase mold portion in the second direction; and a third signal line, connected to the third semiconductor device portion, which protrudes from the upper phase mold portion in the second direction, the lower phase module may further include a fourth signal line, connected to the fourth semiconductor device portion, which protrudes from the lower phase mold portion in the second direction; a fifth signal line, connected to the fifth semiconductor device portion, which protrudes from the lower phase mold portion in the second direction; and a sixth signal line, connected to the sixth semiconductor device portion, which protrudes from the lower phase mold portion in the second direction, the first signal line and the fourth signal line, the second signal line and the fifth signal line, and the third signal line and the sixth signal line may be located at the same positions, respectively, in the first direction, the second signal line may be located at the center of the upper phase module in the first direction, and the first signal line and the third signal line may protrude from positions symmetric with respect to the second signal line in the first direction, and from the same position in the third direction.

Advantageous Effects of Invention

According to an aspect of the present invention, it is possible to use a mold for resin-molding an upper phase module and a mold for resin-molding a lower phase module in common.

DESCRIPTION OF EMBODIMENTS

Figure 1:
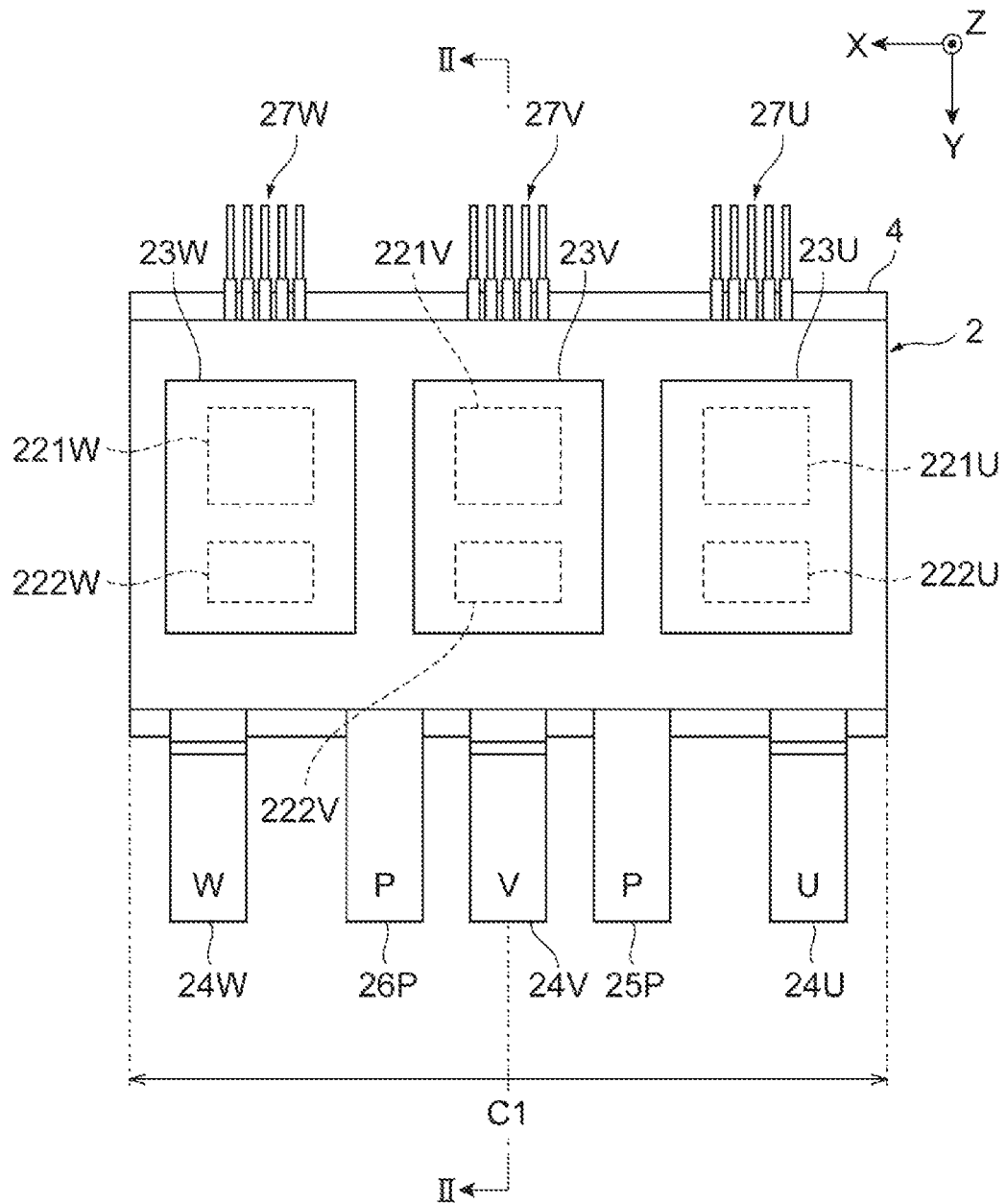
FIG. 1 is a plan view of a three-phase inverter module according to a first embodiment.

Hereinafter, three-phase inverter modules according to embodiments will be described with reference to the accompanying drawings. The three-phase inverter module is also called a power module. Meanwhile, in each drawing, the same or equivalent components are the same reference numerals and signs, and thus the description thereof will not be repeated.

First Embodiment

Figure 2:
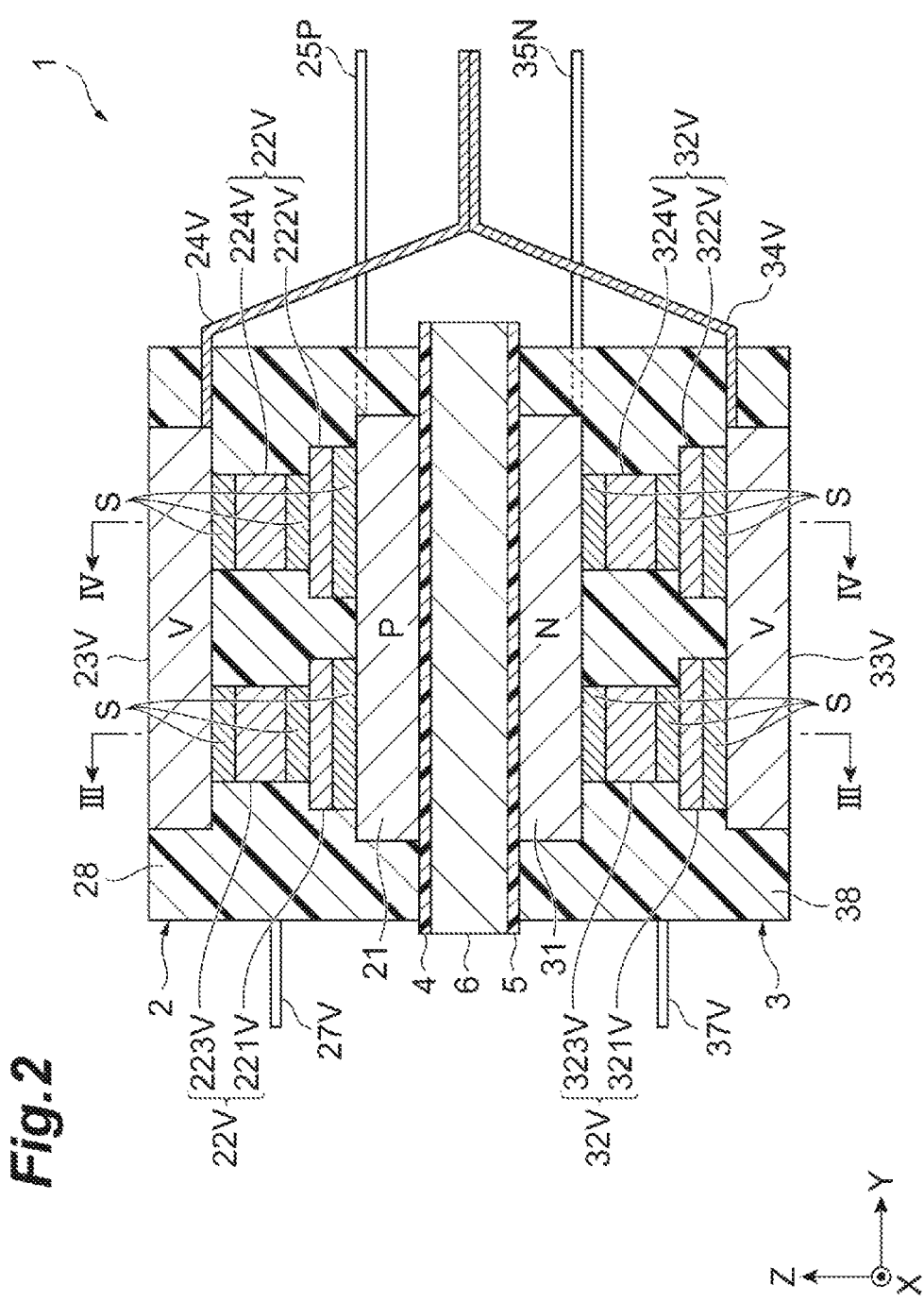
FIG. 2 is a schematic cross-sectional view taken along line II-II shown in FIG. 1.
Figure 3:
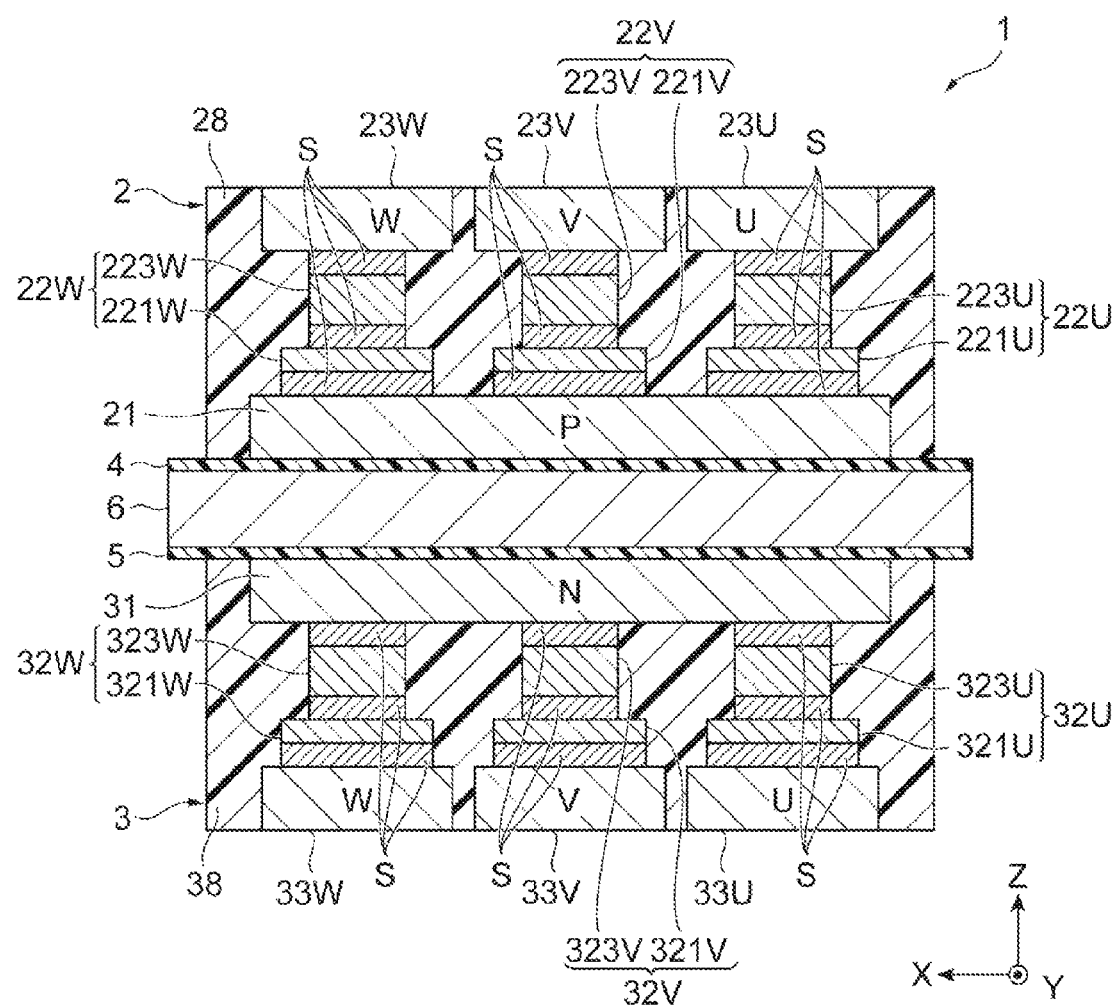
FIG. 3 is a schematic cross-sectional view taken along line III-III shown in FIG. 2.
Figure 4:
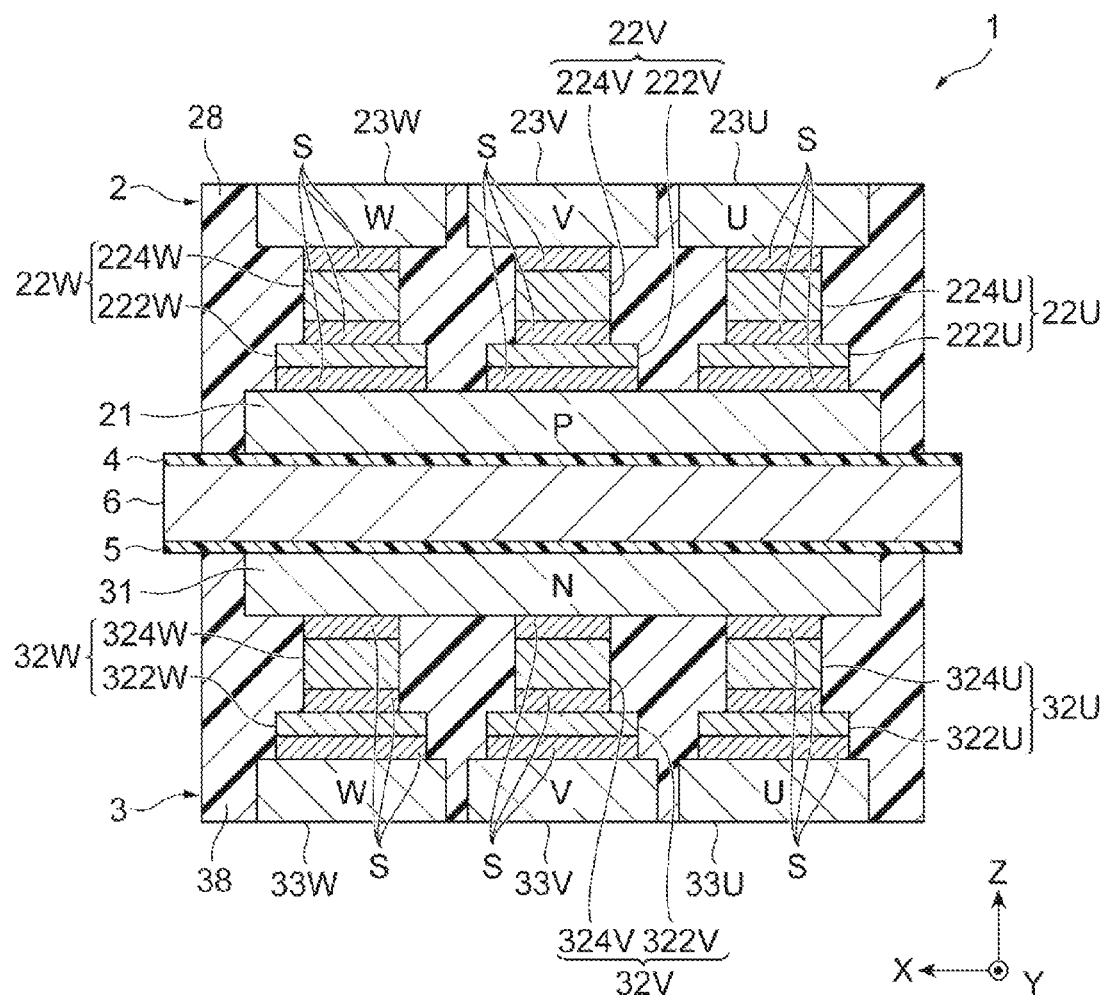
FIG. 4 is a schematic cross-sectional view taken along line IV-IV shown in FIG. 2.

FIG. 1 is a plan view of a three-phase inverter module according to a first embodiment, FIG. 2 is a schematic cross-sectional view taken along line II-II shown in FIG. 1, FIG. 3 is a schematic cross-sectional view taken along line III-III shown in FIG. 2, and FIG. 4 is a schematic cross-sectional view taken along line IV-IV shown in FIG. 2. As shown in FIGS. 1 to 4, a three-phase inverter module 1 according to the first embodiment is configured such that an upper phase module 2 and a lower phase module 3 are opposite to each other. Specifically, the three-phase inverter module 1 is configured such that the upper phase module 2 and the lower phase module 3 which are formed in a card shape are laminated in an opposite direction with an insulating portion 4, a cooler 6 and an insulating portion 5 interposed therebetween. Meanwhile, in the following description, the lamination direction which is an opposite direction between the upper phase module 2 and the lower phase module 3, the thickness direction of the upper phase module 2 and the thickness direction of the lower phase module 3 are set to a Z-direction.

Figure 5:
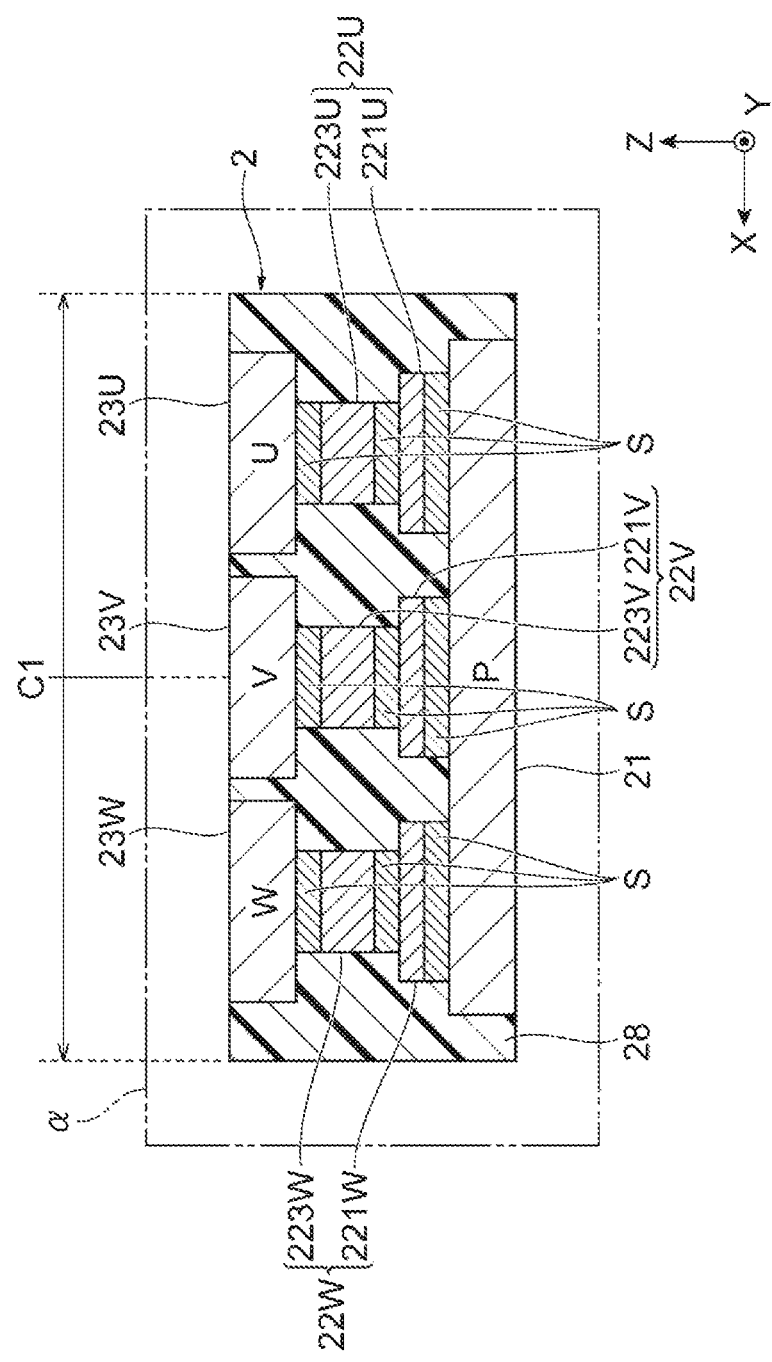
FIG. 5 is a schematic cross-sectional view of an upper phase module taken along line III-III shown in FIG. 2.

FIG. 5 is a schematic cross-sectional view of an upper phase module taken along line III-III shown in FIG. 2. As shown in FIGS. 1 to 5, the upper phase module 2 includes a P electrode 21, a U-phase first semiconductor device portion 22U, a V-phase second semiconductor device portion 22V, a W-phase third semiconductor device portion 22W, a U-phase first electrode 23U, a V-phase second electrode 23V, a W-phase third electrode 23W, a U-phase first signal line 27U, a V-phase second signal line 27V, a W-phase third signal line 27W, and an upper phase mold portion 28.

The upper phase mold portion 28 is resin-molded, and is configured such that the P electrode 21, the first semiconductor device portion 22U, the second semiconductor device portion 22V, the third semiconductor device portion 22W, the first electrode 23U, the second electrode 23V, the third electrode 23W, the first signal line 27U, the second signal line 27V and the third signal line 27W are formed integrally with each other. The upper phase mold portion 28 can be resin-molded by, for example, insert molding.

The first electrode 23U is a U-phase emitter-side bus bar, and is also called a U-phase output bus bar. The second electrode 23V is a V-phase emitter-side bus bar, and is also called a V-phase output bus bar. The third electrode 23W is a W-phase emitter-side bus bar, and is also called a W-phase output bus bar.

The first electrode 23U, the second electrode 23V and the third electrode 23W are arranged in a line in this order. Here, a first direction which is a direction in which the first electrode 23U, the second electrode 23V and the third electrode 23W are arranged is set to an X-direction. In addition, a third direction which is a lamination direction in which the upper phase module 2 and the lower phase module 3 are laminated and a direction perpendicular to the X-direction is set to a Z-direction. In addition, a second direction which is a direction perpendicular to the X-direction and the Y-direction is set to a Y-direction.

When the first electrode 23U, the second electrode 23V and the third electrode 23W are exposed from the upper phase mold portion 28, these electrodes have the next positional relationship. The second electrode 23V serves as a central electrode which is located at a center C1 of the upper phase module 2 in the X-direction. Here, the center C1 of the upper phase module 2 refers to the center C1 of the upper phase module 2 when the upper phase mold portion 28 is resin-molded. For this reason, for example, when the upper phase mold portion 28 is resin-molded and then an addition such as a cooler is resin-molded, to thereby attach the addition to the upper phase mold portion 28, the center of the upper phase module 2 excluding the addition is set to the center C1 of the upper phase module 2. The first electrode 23U and the third electrode 23W serve as a first end electrode and a second end electrode which are located at positions symmetric with respect to the second electrode 23V which is a central electrode in the X-direction, and at the same position in the Z-direction. That is, the first electrode 23U, the second electrode 23V and the third electrode 23W are located so as to be symmetric (plane-symmetric) with respect to a reference surface perpendicular to the X-direction through the center C1 of the upper phase module 2 in the X-direction, with the second electrode 23V being set to the center. Meanwhile, when the first electrode 23U, the second electrode 23V and the third electrode 23W are not exposed from the upper phase mold portion 28, these electrodes may not have the above-mentioned positional relationship.

The P electrode 21 is a collector-side bus bar, and is also called a P bus bar. The number of P electrodes 21 formed is one. The P electrode 21 is opposite to the entire surface of the first electrode 23U, the second electrode 23V and the third electrode 23W in the Z-direction.

When the P electrode 21 is exposed from the upper phase mold portion 28, the electrode is located at the center of the upper phase module 2 in the X-direction and the Y-direction. Meanwhile, when the P electrode 21 is not exposed from the upper phase mold portion 28, the electrode may not be located at the above-mentioned position.

The first semiconductor device portion 22U is provided between the P electrode 21 and the first electrode 23U in the Z-direction. The P electrode 21 and the first electrode 23U are electrically connected to each other through the first semiconductor device portion 22U. The second semiconductor device portion 22V is provided between the P electrode 21 and the second electrode 23V in the Z-direction. The P electrode 21 and the second electrode 23V are electrically connected to each other through the second semiconductor device portion 22V. The third semiconductor device portion 22W is provided between the P electrode 21 and the third electrode 23W in the Z-direction. The P electrode 21 and the third electrode 23W are electrically connected to each other through the third semiconductor device portion 22W. The insulating portion 4 is connected to the P electrode 21. As the insulating portion 4, a ceramic plate, a resin plate or the like can be used.

The first semiconductor device portion 22U includes an IGBT device 221U and an FWD device 222U. The IGBT device 221U is a semiconductor device called an insulating gate bipolar transistor, and the FWD device 222U is a semiconductor device called a free-wheel diode. The IGBT device 221U and the FWD device 222U are arranged in a line in the Y-direction, and the IGBT device 221U is located further backward (upward as shown in FIG. 1) in the Y-direction than the FWD device 222U. A spacer 223U is provided between the IGBT device 221U and the first electrode 23U. The P electrode 21 and the IGBT device 221U, the IGBT device 221U and the spacer 223U, and the spacer 223U and the first electrode 23U are respectively electrically connected to each other by solder S. A spacer 224U is provided between the FWD device 222U and the first electrode 23U. The P electrode 21 and the FWD device 222U, the FWD device 222U and the spacer 224U, and the spacer 224U and the first electrode 23U are respectively electrically connected to each other by the solder S.

The second semiconductor device portion 22V includes an IGBT device 221V and an FWD device 222V. The IGBT device 221V is a semiconductor device called an insulating gate bipolar transistor, and the FWD device 222V is a semiconductor device called a free-wheel diode. The IGBT device 221V and the FWD device 222V are arranged in a line in the Y-direction, and the IGBT device 221V is located further backward (upward as shown in FIG. 1) in the Y-direction than the FWD device 222V. A spacer 223V is provided between the IGBT device 221V and the second electrode 23V. The P electrode 21 and the IGBT device 221V, the IGBT device 221V and the spacer 223V, and the spacer 223V and the second electrode 23V are respectively electrically connected to each other by the solder S. A spacer 224V is provided between the FWD device 222V and the second electrode 23V. The P electrode 21 and the FWD device 222V, the FWD device 222V and the spacer 224V, and the spacer 224V and the second electrode 23V are respectively electrically connected to each other by the solder S.

The third semiconductor device portion 22W includes an IGBT device 221W and an FWD device 222W. The IGBT device 221W is a semiconductor device called an insulating gate bipolar transistor, and the FWD device 222W is a semiconductor device called a free-wheel diode. The IGBT device 221W and the FWD device 222W are arranged in a line in the Y-direction, and the IGBT device 221W is located further backward (upward as shown in FIG. 1) in the Y-direction than the FWD device 222W. A spacer 223W is provided between the IGBT device 221W and the third electrode 23W. The P electrode 21 and the IGBT device 221W, the IGBT device 221W and the spacer 223W, and the spacer 223W and the third electrode 23W are respectively electrically connected to each other by the solder S. A spacer 224W is provided between the FWD device 222W and the third electrode 23W. The P electrode 21 and the FWD device 222W, the FWD device 222W and the spacer 224W, and the spacer 224W and the third electrode 23W are respectively electrically connected to each other by the solder S.

The first signal line 27U is a signal line for transmitting a switching signal for bringing the IGBT device 221U into operation, to the IGBT device 221U. The first signal line 27U is electrically connected to the IGBT device 221U, and extends backward in the Y-direction from the IGBT device 221U. The first signal line 27U is configured such that a plurality of signal lines are bundled into one, and protrudes from the upper phase mold portion 28.

The second signal line 27V is a signal line for transmitting a switching signal for bringing the IGBT device 221V into operation, to the IGBT device 221V. The second signal line 27V is electrically connected to the IGBT device 221V, and extends backward in the Y-direction from the IGBT device 221V. The second signal line 27V is configured such that a plurality of signal lines are bundled into one, and protrudes from the upper phase mold portion 28.

The third signal line 27W is a signal line for transmitting a switching signal for bringing the IGBT device 221W into operation, to the IGBT device 221W. The third signal line 27W is electrically connected to the IGBT device 221W, and extends backward in the Y-direction from the IGBT device 221W. The third signal line 27W is configured such that a plurality of signal lines are bundled into one, and protrudes from the upper phase mold portion 28.

The second signal line 27V is located at the center C1 of the upper phase module 2 in the X-direction. The first signal line 27U and the third signal line 27W protrude from positions symmetric with respect to the second signal line 27V in the X-direction, and from the same position in the Z-direction. That is, the first signal line 27U, the second signal line 27V and the third signal line 27W are symmetric (plane-symmetric) with respect to the reference surface perpendicular to the X-direction through the center C1 of the upper phase module 2 in the X-direction, with the second signal line 27V being set to the center.

In addition, the upper phase module 2 includes a first electrode terminal 24U, a second electrode terminal 24V, a third electrode terminal 24W, a first P terminal 25P, and a second P terminal 26P.

The first electrode terminal 24U is an output terminal which protrudes from the first electrode 23U in the Y-direction, and protrudes from the upper phase mold portion 28 in the Y-direction. The first electrode terminal 24U is also called a U terminal. The first electrode terminal 24U is electrically connected to the IGBT device 221U and the FWD device 222U through the first electrode 23U.

The second electrode terminal 24V is an output terminal which protrudes from the second electrode 23V in the Y-direction, and protrudes from the upper phase mold portion 28 in the Y-direction. The second electrode terminal 24V is also called a V terminal. The second electrode terminal 24V is electrically connected to the IGBT device 221V and the FWD device 222V through the second electrode 23V.

The third electrode terminal 24W is an output terminal which protrudes from the third electrode 23W in the Y-direction, and protrudes from the upper phase mold portion 28 in the Y-direction. The third electrode terminal 24W is also called a W terminal. The third electrode terminal 24W is electrically connected to the IGBT device 221W and the FWD device 222W through the third electrode 23W.

The first electrode terminal 24U, the second electrode terminal 24V and the third electrode terminal 24W, in this order, are arranged in a line in the X-direction. Meanwhile, the first electrode 23U and the first electrode terminal 24U, the second electrode 23V and the second electrode terminal 24V, and the third electrode 23W and the third electrode terminal 24W, respectively, may be located at positions which overlap each other in the Y-direction, or may be located at positions which do not overlap each other in the Y-direction. That is, distances between the first electrode 23U, the second electrode 23V and the third electrode 23W and distances between the first electrode terminal 24U, the second electrode terminal 24V and the third electrode terminal 24W may be the same as each other, and may be different from each other.

The first P terminal 25P and the second P terminal 26P are arranged in a line in the X-direction. The first P terminal 25P and the second P terminal 26P are P terminals which are connected to the high-voltage side (high-potential side) or the low-voltage side (low-potential side) of a direct-current power supply (not shown). Meanwhile, the first P terminal 25P and the second P terminal 26P serve as high-voltage terminals when these terminals are connected to the high-voltage side (high-potential side) of the direct-current power supply (not shown), and serve as low-voltage terminals when these terminals are connected to the low-voltage side (low-potential side) of the direct-current power supply (not shown). The first P terminal 25P and the second P terminal 26P protrude from the P electrode 21 in the Y-direction, and protrude from the upper phase mold portion 28 in the Y-direction. That is, the first P terminal 25P and the second P terminal 26P protrude from one P electrode 21. Meanwhile, a position in the Z-direction at which the first P terminal 25P and the second P terminal 26P protrude from the upper phase module 2 and a position in the Z-direction at which the first electrode terminal 24U, the second electrode terminal 24V and the third electrode terminal 24W protrude from the upper phase module 2 are generally different from each other, but may be the same as each other. In addition, when either the first P terminal 25P and the second P terminal 26P or the first electrode terminal 24U, the second electrode terminal 24V and the third electrode terminal 24W are bent, in consideration of inductance, it is preferable to bend the first electrode terminal 24U, the second electrode terminal 24V and the third electrode terminal 24W, and to linearly extend the first P terminal 25P and the second P terminal 26P.

Any one terminal of the first electrode terminal 24U, the second electrode terminal 24V, the third electrode terminal 24W, the first P terminal 25P and the second P terminal 26P serves as a central terminal which is located at the center C1 of the upper phase module 2 in the X-direction, a pair of terminals other than the central terminal serve as a first inside terminal and a second inside terminal which protrude from positions symmetric with respect to the central terminal in the X-direction, and from the same position in the Z-direction, and the remaining pair of terminals serve as a first outside terminal and a second outside terminal which are located so as to interpose the first inside terminal and the second inside terminal therebetween in the X-direction. That is, the remaining pair of terminals serve as a first outside terminal and a second outside terminal which are located outside a region between the first inside terminal and the second inside terminal in the X-direction. The first outside terminal and the second outside terminal protrude from positions symmetric with respect to the central terminal in the X-direction, and from the same position in the Z-direction.

Specifically, the second electrode terminal 24V serves as a central terminal which is located at the center C1 of the upper phase module 2 in the X-direction. The first P terminal 25P and the second P terminal 26P protrude from positions symmetric with respect to the second electrode terminal 24V in the X-direction, and from the same position in the Z-direction. In addition, the first electrode terminal 24U and the third electrode terminal 24W protrude from positions symmetric with respect to the second electrode terminal 24V in the X-direction, and from the same position in the Z-direction. More specifically, the first P terminal 25P and the second P terminal 26P serve as a first inside terminal and a second inside terminal which protrude from positions symmetric with respect to the second electrode terminal 24V in the X-direction, and from the same position in the Z-direction. The first electrode terminal 24U and the third electrode terminal 24W serve as a first outside terminal and a second outside terminal which are located so as to interpose the first P terminal 25P and the second P terminal 26P therebetween in the X-direction, and protrude from positions symmetric with respect to the second electrode terminal 24V in the X-direction, and from the same position in the Z-direction. That is, the protruding positions of the first electrode terminal 24U, the second electrode terminal 24V, the third electrode terminal 24W, the first P terminal 25P and the second P terminal 26P are symmetric (plane-symmetric) with respect to the reference surface perpendicular to the X-direction through the center C1 of the upper phase module 2 in the X-direction, with the protruding position of the second electrode terminal 24V being set to the center.

Figure 6:
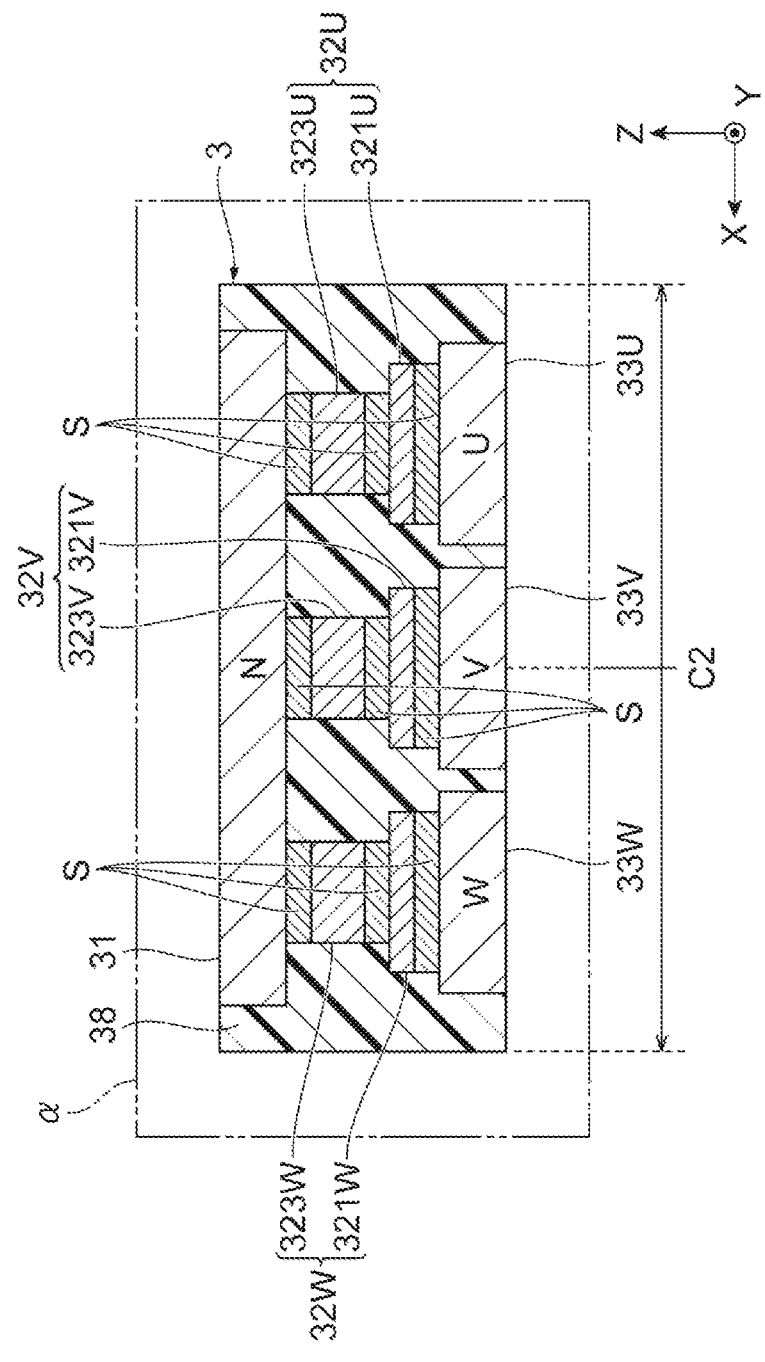
FIG. 6 is a schematic cross-sectional view of a lower phase module taken along line III-III shown in FIG. 2.
Figure 7:
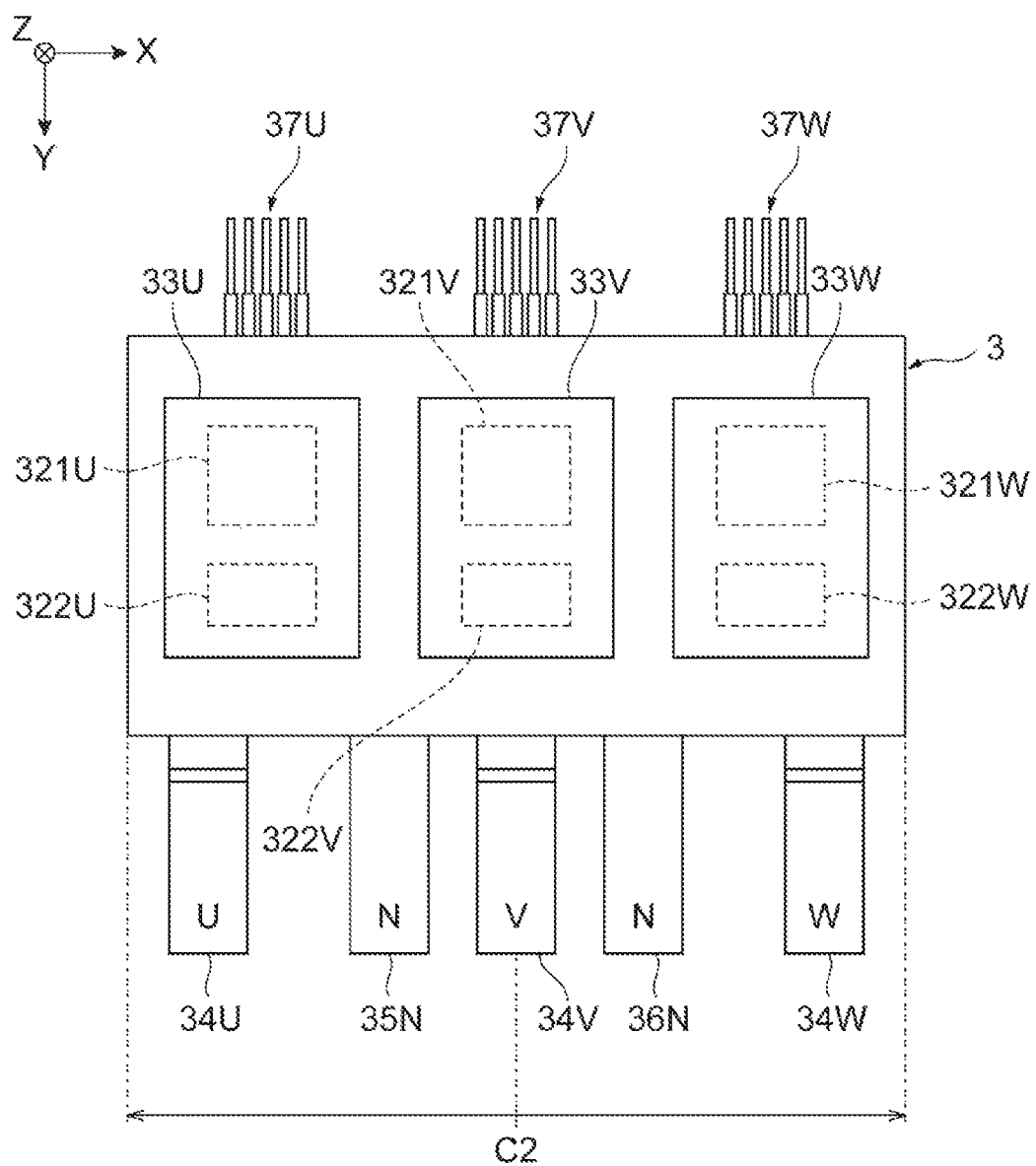
FIG. 7 is a schematic plan view when the lower phase module is seen from an output terminal side.

FIG. 6 is a schematic cross-sectional view of a lower phase module taken along line III-III shown in FIG. 2, and FIG. 7 is a schematic plan view when the lower phase module is seen from an output terminal side (lower side of FIG. 2). As shown in FIGS. 2 to 4, 6 and 7, the lower phase module 3 includes an N electrode 31, a U-phase fourth semiconductor device portion 32U, a V-phase fifth semiconductor device portion 32V, a W-phase sixth semiconductor device portion 32W, a U-phase fourth electrode 33U, a V-phase fifth electrode 33V, a W-phase sixth electrode 33W, a U-phase fourth signal line 37U, a V-phase fifth signal line 37V, a W-phase sixth signal line 37W, and a lower phase mold portion 38.

The lower phase mold portion 38 is resin-molded, and is configured such that the N electrode 31, the fourth semiconductor device portion 32U, the fifth semiconductor device portion 32V, the sixth semiconductor device portion 32W, the fourth electrode 33U, the fifth electrode 33V, the sixth electrode 33W, the fourth signal line 37U, the fifth signal line 37V and the sixth signal line 37W are formed integrally with each other. The lower phase mold portion 38 can be resin-molded by, for example, insert molding.

The fourth electrode 33U is a U-phase collector-side bus bar, and is also called a U-phase output bus bar. The fifth electrode 33V is a V-phase collector-side bus bar, and is also called a V-phase output bus bar. The sixth electrode 33W is a W-phase collector-side bus bar, and is also called a W-phase output bus bar.

The fourth electrode 33U, the fifth electrode 33V and the sixth electrode 33W, in this order, are arranged in a line in the X-direction.

When the fourth electrode 33U, the fifth electrode 33V and the sixth electrode 33W are exposed from the lower phase mold portion 38, these electrodes have the next positional relationship. The fifth electrode 33V serves as a central electrode which is located at a center of the lower phase module 3 in the X-direction. Here, the center C2 of the lower phase module 3 refers to the center C2 of the lower phase module 3 when the lower phase mold portion 38 is resin-molded. For this reason, for example, when the lower phase mold portion 38 is resin-molded and then an addition such as a cooler is resin-molded, to thereby attach the addition to the lower phase mold portion 38, the center of the lower phase module 3 excluding the addition is set to the center C2 of the lower phase module 3. The fourth electrode 33U and the sixth electrode 33W serve as a first end electrode and a second end electrode which are located at positions symmetric with respect to the fifth electrode 33V which is a central electrode in the X-direction, and at the same position in the Z-direction. That is, the fourth electrode 33U, the fifth electrode 33V and the sixth electrode 33W are located so as to be symmetric (plane-symmetric) with respect to a reference surface perpendicular to the X-direction through the center C2 of the lower phase module 3 in the X-direction, with the fifth electrode 33V being set to the center.

The N electrode 31 is an emitter-side bus bar, and is also called an N bus bar. The number of N electrodes 31 formed is one. The N electrode 31 is opposite to the entire surface of the fourth electrode 33U, the fifth electrode 33V and the sixth electrode 33W in the Z-direction.

When the N electrode 31 is exposed from the lower phase mold portion 38, the electrode is located at the center of the lower phase module 3 in the X-direction and the Y-direction. Meanwhile, when the N electrode 31 is not exposed from the lower phase mold portion 38, the electrode may not be located at the above-mentioned position.

The fourth semiconductor device portion 32U is provided between the N electrode 31 and the fourth electrode 33U in the Z-direction. The N electrode 31 and the fourth electrode 33U are electrically connected to each other through the fourth semiconductor device portion 32U. The fifth semiconductor device portion 32V is provided between the N electrode 31 and the fifth electrode 33V in the Z-direction. The N electrode 31 and the fifth electrode 33V are electrically connected to each other through the fifth semiconductor device portion 32V. The sixth semiconductor device portion 32W is provided between the N electrode 31 and the sixth electrode 33W in the Z-direction. The N electrode 31 and the sixth electrode 33W are electrically connected to each other through the sixth semiconductor device portion 32W. The insulating portion 5 is connected to the N electrode 31. As the insulating portion 5, a ceramic plate, a resin plate or the like can be used.

The fourth semiconductor device portion 32U includes an IGBT device 321U and an FWD device 322U. The IGBT device 321U is a semiconductor device called an insulating gate bipolar transistor, and the FWD device 322U is a semiconductor device called a free-wheel diode. The IGBT device 321U and the FWD device 322U are arranged in a line in the Y-direction, and the IGBT device 321U is located further backward (upward as shown in FIG. 7) in the Y-direction than the FWD device 322U. A spacer 323U is provided between the IGBT device 321U and the N electrode 31. The N electrode 31 and the spacer 323U, the spacer 323U and the IGBT device 321U, and the IGBT device 321U and the fourth electrode 33U are respectively electrically connected to each other by the solder S. A spacer 324U is provided between the FWD device 322U and the N electrode 31. The N electrode 31 and the spacer 324U, the spacer 324U and the FWD device 322U, and the FWD device 322U and the fourth electrode 33U are respectively electrically connected to each other by the solder S.

The fifth semiconductor device portion 32V includes an IGBT device 321V and an FWD device 322V. The IGBT device 321V is a semiconductor device called an insulating gate bipolar transistor, and the FWD device 322V is a semiconductor device called a free-wheel diode. The IGBT device 321V and the FWD device 322V are arranged in a line in the Y-direction, and the IGBT device 321V is located further backward (upward as shown in FIG. 7) in the Y-direction than the FWD device 322V. A spacer 323V is provided between the IGBT device 321V and the N electrode 31. The N electrode 31 and the spacer 323V, the spacer 323V and the IGBT device 321V, and the IGBT device 321V and the fifth electrode 33V are respectively electrically connected to each other by the solder S. A spacer 324V is provided between the FWD device 322V and the N electrode 31. The N electrode 31 and the spacer 324V, the spacer 324V and the FWD device 322V, and the FWD device 322V and the fifth electrode 33V are respectively electrically connected to each other by the solder S.

The sixth semiconductor device portion 32W includes an IGBT device 321W and an FWD device 322W. The IGBT device 321W is a semiconductor device called an insulating gate bipolar transistor, and the FWD device 322W is a semiconductor device called a free-wheel diode. The IGBT device 321W and the FWD device 322W are arranged in a line in the Y-direction, and the IGBT device 321W is located further backward (upward as shown in FIG. 7) in the Y-direction than the FWD device 322W. A spacer 323W is provided between the IGBT device 321W and the N electrode 31. The N electrode 31 and the spacer 323W, the spacer 323W and the IGBT device 321W, and the IGBT device 321W and the sixth electrode 33W are respectively electrically connected by the solder S. A spacer 324W is provided between the FWD device 322W and the N electrode 31. The N electrode 31 and the spacer 324W, the spacer 324W and the FWD device 322W, and the FWD device 322W and the sixth electrode 33W are respectively electrically connected to each other by the solder S.

The fourth signal line 37U is a signal line for transmitting a switching signal for bringing the IGBT device 321U into operation, to the IGBT device 321U. The fourth signal line 37U is electrically connected to the IGBT device 321U, and extends backward in the Y-direction from the IGBT device 321U. The fourth signal line 37U is configured such that a plurality of signal lines are bundled into one, and protrudes from the lower phase mold portion 38.

The fifth signal line 37V is a signal line for transmitting a switching signal for bringing the IGBT device 321V into operation, to the IGBT device 321V. The fifth signal line 37V is electrically connected to the IGBT device 321V, and extends backward in the Y-direction from the IGBT device 321V. The fifth signal line 37V is configured such that a plurality of signal lines are bundled into one, and protrudes from the lower phase mold portion 38.

The sixth signal line 37W is a signal line for transmitting a switching signal for bringing the IGBT device 321W into operation, to the IGBT device 321W. The sixth signal line 37W is electrically connected to the IGBT device 321W, and extends backward in the Y-direction from the IGBT device 321W. The sixth signal line 37W is configured such that a plurality of signal lines are bundled into one, and protrudes from the lower phase mold portion 38.

The fifth signal line 37V is located at the center C2 of the lower phase module 3 in the X-direction. The fourth signal line 37U and the sixth signal line 37W protrude from positions symmetric with respect to the fifth signal line 37V in the X-direction, and from the same position in the Z-direction. That is, the fourth signal line 37U, the fifth signal line 37V and the sixth signal line 37W are symmetric (plane-symmetric) with respect to the reference surface perpendicular to the X-direction through the center C2 of the lower phase module 3 in the X-direction, with the fifth signal line 37V being set to the center.

In addition, the lower phase module 3 includes a fourth electrode terminal 34U, a fifth electrode terminal 34V, a sixth electrode terminal 34W, a first N terminal 35N, and a second N terminal 36N.

The fourth electrode terminal 34U is an output terminal which protrudes from the fourth electrode 33U in the Y-direction, and protrudes from the lower phase mold portion 38 in the Y-direction. The fourth electrode terminal 34U is also called a U terminal. The fourth electrode terminal 34U is electrically connected to the IGBT device 321U and the FWD device 322U through the fourth electrode 33U.

The fifth electrode terminal 34V is an output terminal which protrudes from the fifth electrode 33V in the Y-direction, and protrudes from the lower phase mold portion 38 in the Y-direction. The fifth electrode terminal 34V is also called a V terminal. The fifth electrode terminal 34V is electrically connected to the IGBT device 321V and the FWD device 322V through the fifth electrode 33V.

The sixth electrode terminal 34W is an output terminal which protrudes from the sixth electrode 33W in the Y-direction, and protrudes from the lower phase mold portion 38 in the Y-direction. The sixth electrode terminal 34W is also called a W terminal. The sixth electrode terminal 34W is electrically connected to the IGBT device 321W and the FWD device 322W through the sixth electrode 33W.

The fourth electrode terminal 34U, the fifth electrode terminal 34V and the sixth electrode terminal 34W, in this order, are arranged in a line in the X-direction. Meanwhile, the fourth electrode 33U and the fourth electrode terminal 34U, the fifth electrode 33V and the fifth electrode terminal 34V, and the sixth electrode 33W and the sixth electrode terminal 34W, respectively, may be located at positions which overlap each other in the Y-direction, or may be located at positions which do not overlap each other in the Y-direction. That is, distances between the fourth electrode 33U, the fifth electrode 33V and the sixth electrode 33W and distances between the fourth electrode terminal 34U, the fifth electrode terminal 34V and the sixth electrode terminal 34W may be the same as each other, and may be different from each other.

The first N terminal 35N and the second N terminal 36N are arranged in a line in the X-direction. The first N terminal 35N and the second N terminal 36N are N terminals which are connected to the low-voltage side (low-potential side) or the high-voltage side (high-potential side) of a direct-current power supply (not shown). Meanwhile, the first N terminal 35N and the second N terminal 36N serve as low-voltage terminals when these terminals are connected to the low-voltage side (low-potential side) of the direct-current power supply (not shown), and serve as high-voltage terminals when these terminals are connected to the high-voltage side (high-potential side) of the direct-current power supply (not shown). The first N terminal 35N and the second N terminal 36N protrude from the N electrode 31 in the Y-direction, and protrude from the lower phase mold portion 38 in the Y-direction. That is, the first N terminal 35N and the second N terminal 36N protrude from one N electrode 31. Meanwhile, a position in the Z-direction at which the first N terminal 35N and the second N terminal 36N protrude from the lower phase module 3 and a position in the Z-direction at which the fourth electrode terminal 34U, the fifth electrode terminal 34V and the sixth electrode terminal 34W protrude from the lower phase module 3 are generally different from each other, but may be the same as each other.

In addition, when either the first N terminal 35N and the second N terminal 36N or the fourth electrode terminal 34U, the fifth electrode terminal 34V and the sixth electrode terminal 34W are bent, in consideration of inductance, it is preferable to bend the fourth electrode terminal 34U, the fifth electrode terminal 34V and the sixth electrode terminal 34W, and to linearly extend the first N terminal 35N and the second N terminal 36N.

Any one terminal of the fourth electrode terminal 34U, the fifth electrode terminal 34V, the sixth electrode terminal 34W, the first N terminal 35N and the second N terminal 36N serves as a central terminal which is located at the center C2 of the lower phase module 3 in the X-direction, a pair of terminals other than the central terminal serve as a first inside terminal and a second inside terminal which protrude from positions symmetric with respect to the central terminal in the X-direction, and from the same position in the Z-direction, and the remaining pair of terminals serve as a first outside terminal and a second outside terminal which are located so as to interpose the first inside terminal and the second inside terminal therebetween in the X-direction. That is, the remaining pair of terminals serve as a first outside terminal and a second outside terminal which are located outside a region between the first inside terminal and the second inside terminal in the X-direction. The first outside terminal and the second outside terminal protrude from positions symmetric with respect to the central terminal in the X-direction, and from the same position in the Z-direction.

Specifically, the fifth electrode terminal 34V serves as a central terminal which is located at the center C2 of the lower phase module 3 in the X-direction. The first N terminal 35N and the second N terminal 36N protrude from positions symmetric with respect to the fifth electrode terminal 34V in the X-direction, and from the same position in the Z-direction. In addition, the fourth electrode terminal 34U and the sixth electrode terminal 34W protrude from positions symmetric with respect to the fifth electrode terminal 34V in the X-direction, and from the same position in the Z-direction. More specifically, the first N terminal 35N and the second N terminal 36N serve as a first inside terminal and a second inside terminal which protrude from positions symmetric with respect to the fifth electrode terminal 34V in the X-direction, and from the same position in the Z-direction. The fourth electrode terminal 34U and the sixth electrode terminal 34W serve as a first outside terminal and a second outside terminal which are located so as to interpose the first N terminal 35N and the second N terminal 36N therebetween in the X-direction, and protrude from positions symmetric with respect to the fifth electrode terminal 34V in the X-direction, and from the same position in the Z-direction. That is, the protruding positions of the fourth electrode terminal 34U, the fifth electrode terminal 34V, the sixth electrode terminal 34W, the first N terminal 35N and the second N terminal 36N are symmetric (plane-symmetric) with respect to the reference surface perpendicular to the X-direction through the center C2 of the lower phase module 3 in the X-direction, with the protruding position of the fifth electrode terminal 34V being set to the center.

As shown in FIGS. 2 to 4, the upper phase module 2 and the lower phase module 3 are laminated with the insulating portion 4, the cooler 6 and the insulating portion 5 interposed therebetween, and the first electrode terminal 24U and the fourth electrode terminal 34U, the second electrode terminal 24V and the fifth electrode terminal 34V, the third electrode terminal 24W and the sixth electrode terminal 34W, the first P terminal 25P and the first N terminal 35N, the second P terminal 26P and the second N terminal 36N, the first signal line 27U and the fourth signal line 37U, the second signal line 27V and the fifth signal line 37V, the third signal line 27W and the sixth signal line 37W are located at the same positions, respectively, in the X-direction. Thereby, the protruding positions of the first electrode terminal 24U, the second electrode terminal 24V, the third electrode terminal 24W, the first P terminal 25P, the second P terminal 26P, the first signal line 27U, the second signal line 27V and the third signal line 27W in the upper phase module 2, and the protruding positions of the fourth electrode terminal 34U, the fifth electrode terminal 34V, the sixth electrode terminal 34W, the first N terminal 35N, the second N terminal 36N, the fourth signal line 37U, the fifth signal line 37V and the sixth signal line 37W in the lower phase module 3 have the same positional relationship as each other. When each electrode of the upper phase module 2 is exposed from the upper phase mold portion 28, and each electrode of the lower phase module 3 is exposed from the lower phase mold portion 38, the first electrode 23U and the fourth electrode 33U, the second electrode 23V and the fifth electrode 33V, the third electrode 23W and the sixth electrode 33W, and the P electrode 21 and the N electrode 31 are also located at the same positions, respectively, in the X-direction. Meanwhile, the first semiconductor device portion 22U and the fourth semiconductor device portion 32U, the second semiconductor device portion 22V and the fifth semiconductor device portion 32V, and the third semiconductor device portion 22W and the sixth semiconductor device portion 32W may also be located at the same positions, respectively, in the X-direction.

Figure 8:
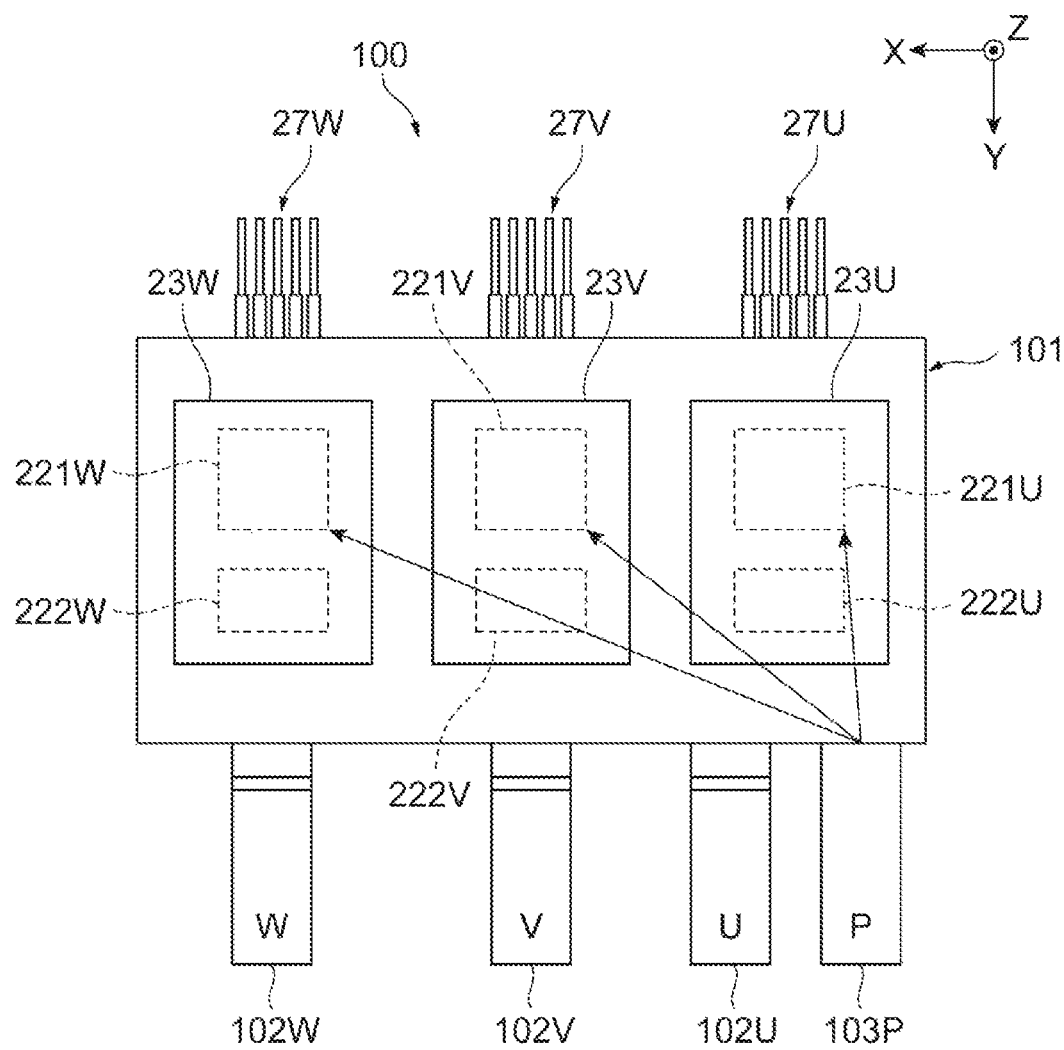
FIG. 8 is a schematic bottom view when an upper phase module constituting a three-phase inverter module which is a comparative example is seen from the output terminal side.
Figure 9:
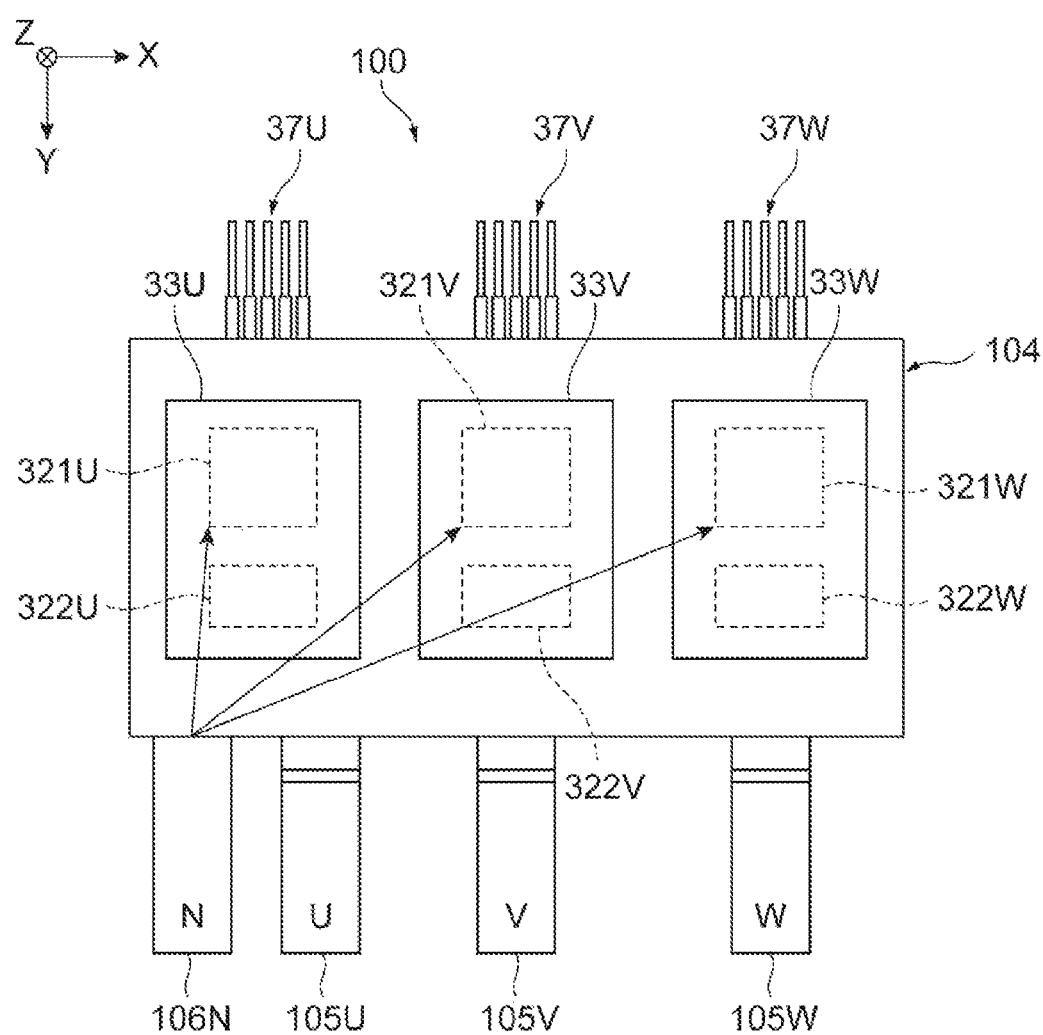
FIG. 9 is a schematic plan view when a lower phase module constituting the three-phase inverter module which is a comparative example is seen from the output terminal side.

Here, a three-phase inverter module of a comparative example in which only one P electrode and only one N electrode are provided will be described with reference to FIGS. 8 and 9. FIG. 8 is a schematic bottom view when an upper phase module constituting the three-phase inverter module of the comparative example is seen from the output terminal side. FIG. 9 is a schematic plan view when a lower phase module constituting the three-phase inverter module of the comparative example is seen from the output terminal side. FIG. 8 is a drawing corresponding to FIG. 1, and FIG. 9 is a drawing corresponding to FIG. 7.

As shown in FIGS. 8 and 9, a three-phase inverter module 100 of the comparative example is configured such that an upper phase module 101 and a lower phase module 104 are laminated with a cooler (not shown) interposed therebetween.

As shown in FIG. 8, similarly to the upper phase module 2 of the present embodiment, the upper phase module 101 includes a P electrode (not shown), a first electrode 23U, a second electrode 23V, a third electrode 23W, a U-phase semiconductor device portion (not shown), a V-phase semiconductor device portion (not shown), and a W-phase semiconductor device portion (not shown). Meanwhile, the U-phase semiconductor device portion (not shown) includes an IGBT device 221U and an FWD device 222U. The V-phase semiconductor device portion (not shown) includes an IGBT device 221V and an FWD device 222V. The W-phase semiconductor device portion (not shown) includes an IGBT device 221W and an FWD device 222W.

A first electrode terminal 102U corresponding to the first electrode terminal 24U of the present embodiment protrudes from the first electrode 23U, a second electrode terminal 102V corresponding to the second electrode terminal 24V of the present embodiment protrudes from the second electrode 23V, and a third electrode terminal 102W corresponding to the third electrode terminal 24W of the present embodiment protrudes from the third electrode 23W. However, only one P terminal 103P protrudes from the P electrode. The P terminal 103P, the first electrode terminal 102U, the second electrode terminal 102V and the third electrode terminal 102W, in this order, are arranged in a line in the X-direction.

As shown in FIG. 9, similarly to the lower phase module 3 of the present embodiment, the lower phase module 104 includes an N electrode (not shown), a fourth electrode 33U, a fifth electrode 33V, a sixth electrode 33W, a U-phase semiconductor device portion (not shown), a V-phase semiconductor device portion (not shown), and a W-phase semiconductor device portion (not shown). Meanwhile, the U-phase semiconductor device portion (not shown) includes an IGBT device 321U and an FWD device 322U. The V-phase semiconductor device portion (not shown) includes an IGBT device 321V and an FWD device 322V. The W-phase semiconductor device portion (not shown) includes an IGBT device 321W and an FWD device 322W.

A fourth electrode terminal 105U corresponding to the fourth electrode terminal 34U of the present embodiment protrudes from the fourth electrode 33U, a fifth electrode terminal 105V corresponding to the fifth electrode terminal 34V of the present embodiment protrudes from the fifth electrode 33V, and a sixth electrode terminal 105W corresponding to the sixth electrode terminal 34W of the present embodiment protrudes from the sixth electrode 33W. However, only one N terminal 106N protrudes from the N electrode. The N terminal 106N, the fourth electrode terminal 105U, the fifth electrode terminal 105V and the sixth electrode terminal 105W, in this order, are arranged in a line in the X-direction.

In this manner, in the three-phase inverter module 100 of the comparative example, only one P terminal 103P and only one N terminal 106N are provided. For this reason, the position of the P terminal 103P in the upper phase module 101 and the position of the N terminal 106N in the lower phase module 104 are different from each other. As a result, a mold for resin-molding the upper phase module 101 and a mold for resin-molding the lower phase module 104 are different from each other, and thus these molds cannot be used in common.

Furthermore, since it is necessary to exceed the V-phase semiconductor device portion from the P terminal 103P and the N terminal 106N to the IGBT device 221W and the IGBT device 321W, a distance between the P terminal 103P and the IGBT device 221W and a distance between the N terminal 106N and the IGBT device 321W become larger, and thus self-inductance cannot be sufficiently reduced.

On the other hand, in the three-phase inverter module 100 according to the present embodiment, since the symmetry of each terminal in the upper phase module 2 and the lower phase module 3 can be secured, the shape of the upper phase mold portion 28 and the shape of the lower phase mold portion 38 can be made to coincide with each other. Thereby, a mold for resin-molding the upper phase module 2 and a mold for resin-molding the lower phase module 3 can be used in common.

Consequently, for example, when the upper phase module 2 is resin-molded, first, a common mold α for resin-molding the upper phase module 2 and the lower phase module 3 are prepared as shown in FIG. 5. Next, the first electrode terminal 24U, the second electrode terminal 24V, the third electrode terminal 24W, the first P terminal 25P and the second P terminal 26P are interposed in the mold α so that the first semiconductor device portion 22U, the second semiconductor device portion 22V, the third semiconductor device portion 22W, the first electrode 23U, the second electrode 23V, the third electrode 23W, and the P electrode 21 are received within the mold α. Next, molten resin is caused to flow into the mold α, and the mold α is removed when the molten resin is cured. Thereby, the upper phase module 2 is resin-molded.

In addition, for example, when the lower phase module 3 is resin-molded, first, the common mold α for resin-molding the upper phase module 2 and the lower phase module 3 are prepared as shown in FIG. 6. Next, the fourth electrode terminal 34U, the fifth electrode terminal 34V, the sixth electrode terminal 34W, the first N terminal 35N and the second N terminal 36N are interposed in to mold α so that the fourth semiconductor device portion 32U, the fifth semiconductor device portion 32V, the sixth semiconductor device portion 32W, the fourth electrode 33U, the fifth electrode 33V, the sixth electrode 33W, and the N electrode 31 are received within the mold α. Next, molten resin is caused to flow into the mold α, and the mold α is removed when the molten resin is cured. Thereby, the lower phase module 3 is resin-molded.

In this manner, the mold α for resin-molding the upper phase module 2 and the mold α for resin-molding the lower phase module 3 can be used in common, and thus it is possible to reduce the manufacturing cost of the three-phase inverter module 1.

Figure 10:
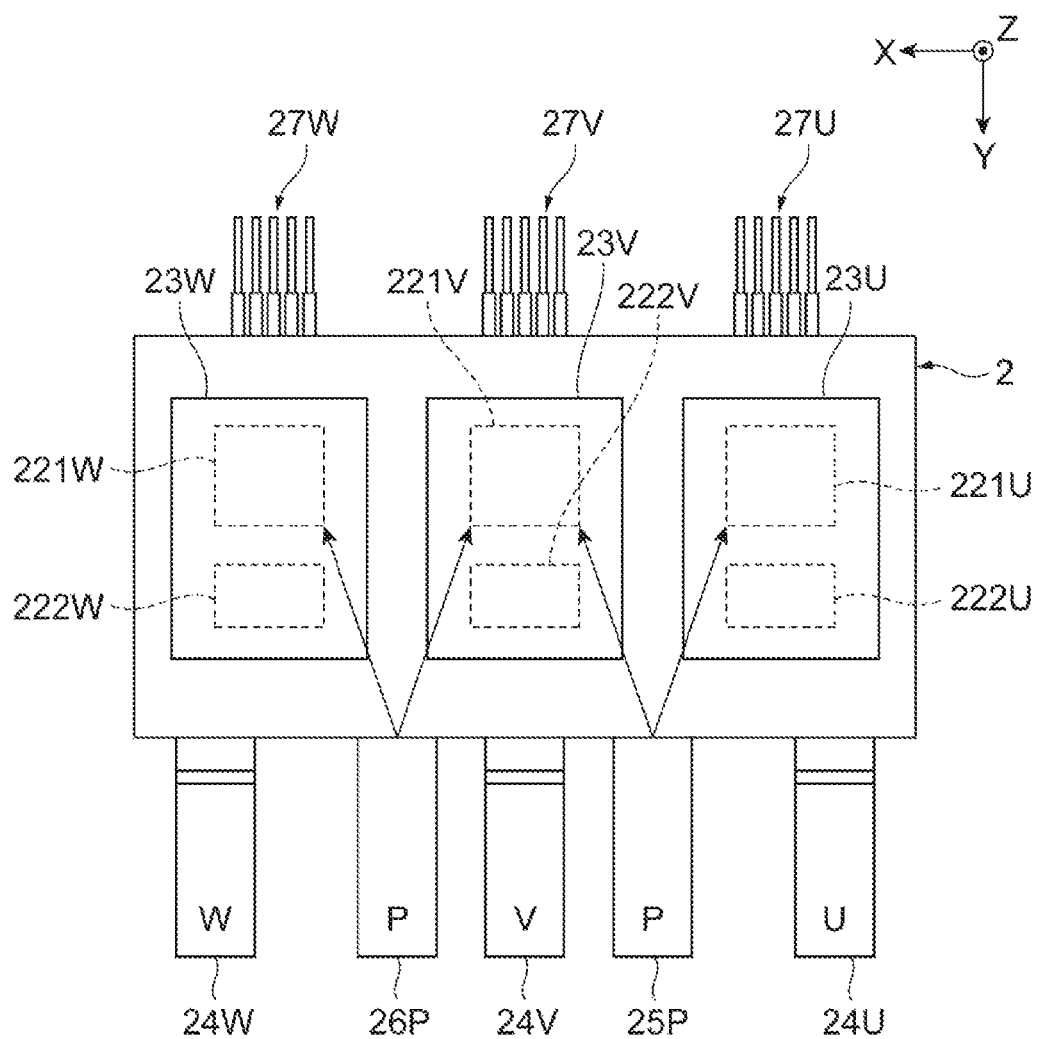
FIG. 10 is a diagram illustrating a distance between a first P terminal and second P terminal, and each semiconductor device.

Furthermore, the first P terminal 25P, the second P terminal 26P, the first N terminal 35N and the second N terminal 36N are located between each electrode terminal in the X-direction. For this reason, as shown in FIGS. 8 to 10, it is possible to make distances between the P terminal and the N the terminal, and each semiconductor device shorter than in the three-phase inverter module 100 of the comparative example. Thereby, it is possible to reduce self-inductance.

Further, the first P terminal 25P and the second P terminal 26P are included as the P terminal, and the first N terminal 35N and the second N terminal 36N are included as the N terminal, whereby it is possible to make the surface areas of the P terminal and the N terminal larger than the three-phase inverter module 100 of the comparative example. Thereby, it is possible to reduce self-inductance.

In addition, the second electrode terminal 24V is set to a central terminal, and the first electrode terminal 24U and the third electrode terminal 24W, and the first P terminal 25P and the second P terminal 26P are symmetrically located. Thereby, the symmetry of each terminal in the upper phase module 2 and the lower phase module 3 can be secured without changing the position of each terminal in the Z-direction.

Figure 11:
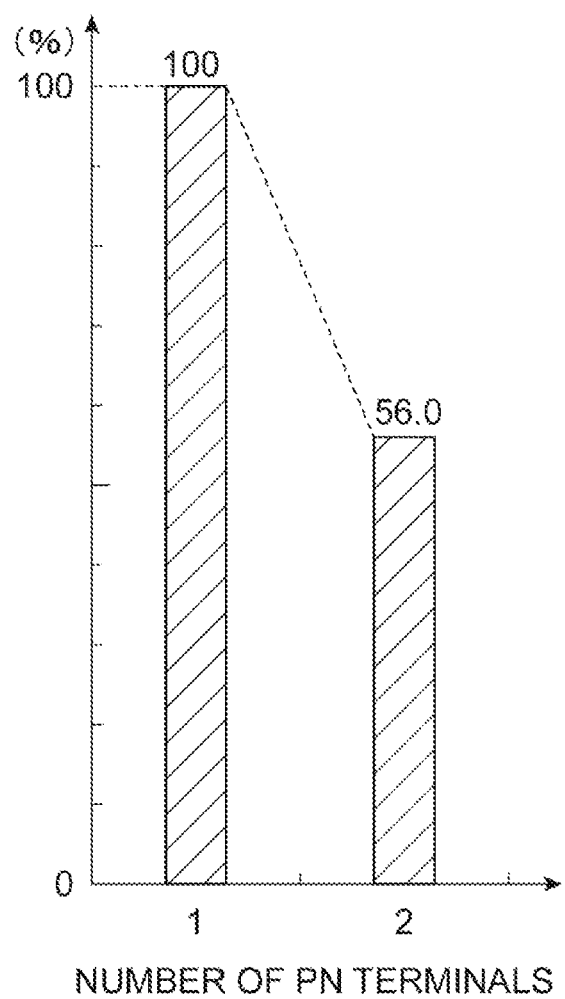
FIG. 11 is a diagram illustrating measurement results of inductance.

Here, an example of the inductance of the three-phase inverter module will be described. The inventors have measured inductance with respect to a case where one P terminal and one N terminal are formed and a case where two P terminals and two N terminals are formed. The measurement results are shown in FIG. 11. In the measurement results of FIG. 11, percentage (%) obtained by calculating inductance when two P terminals and two N terminals are formed in terms of 100% is shown.

As shown in FIG. 11, when two P terminals and two N terminals are formed as in the three-phase inverter module 1 according to the present embodiment, inductance has been 46% lower than when one P terminal and one N terminal are formed as in the three-phase inverter module 100 of the comparative example. From such measurement results, it has been understood that the formation of two P terminals and two N terminals can result in a reduction in inductance by half as compared to a case when one P terminal and one N terminal are received.

Second Embodiment

Next, a three-phase inverter module according to a second embodiment will be described. A three-phase inverter module 1A according to the second embodiment is basically the same as the three-phase inverter module 1 according to the first embodiment, but both the modules are different from each other in only the positional relationship between the upper phase module 2 and the lower phase module 3, and only the shape of the output terminal. For this reason, the same description as that in the first embodiment will not be given, and only particulars different from those in the first embodiment will be described.

Figure 12:
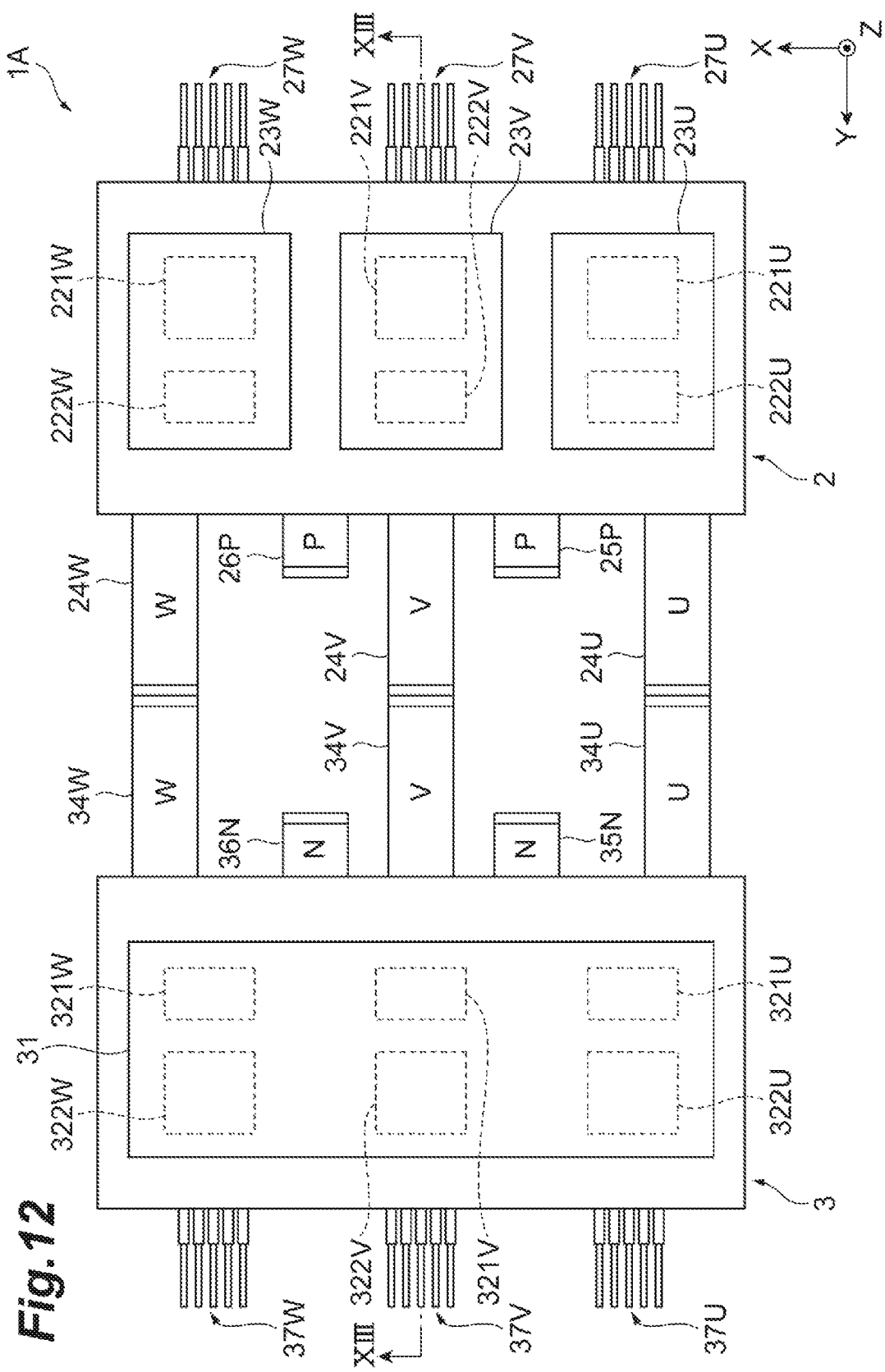
FIG. 12 is a plan view of a three-phase inverter module according to a second embodiment.
Figure 13:
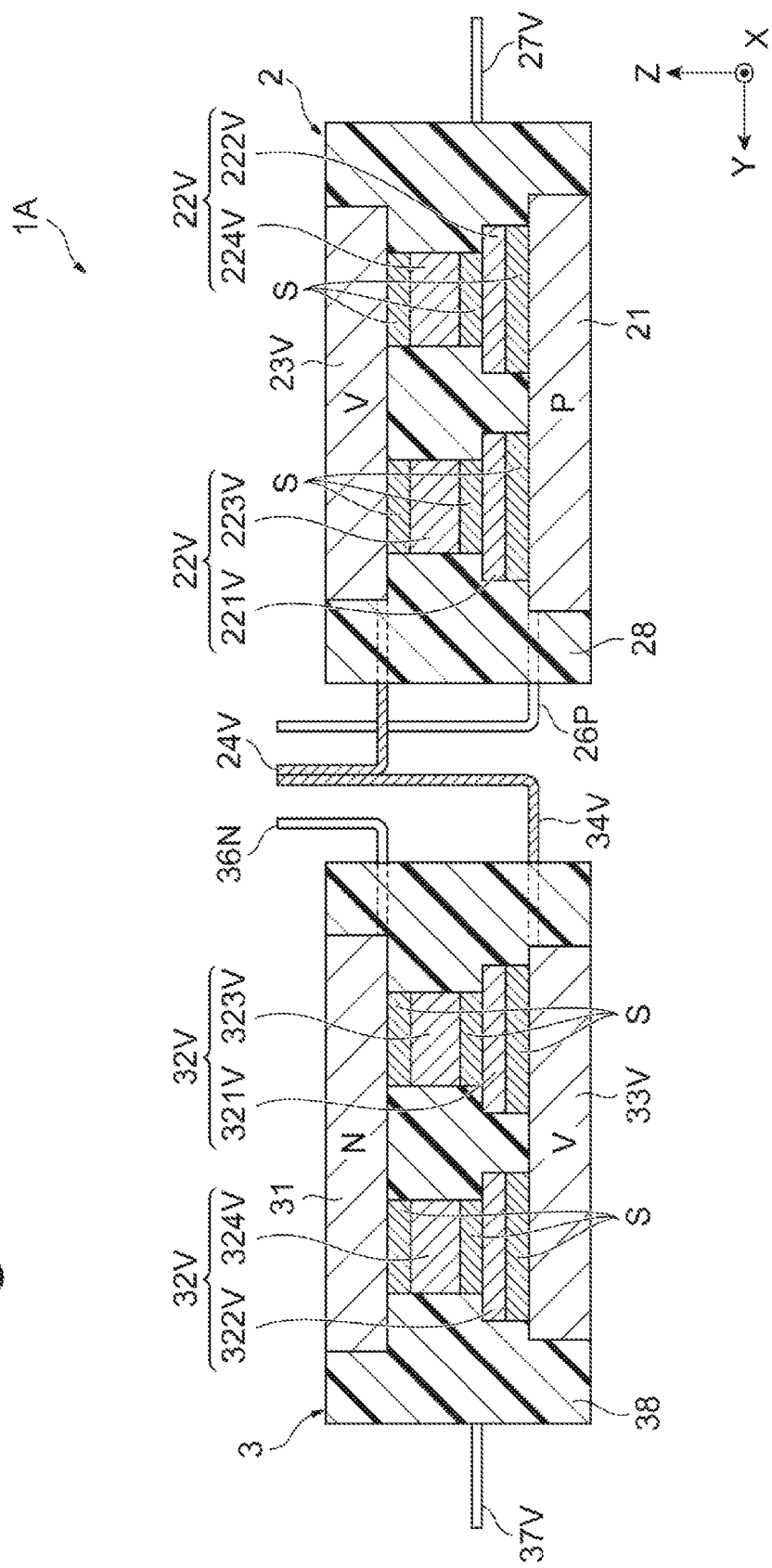
FIG. 13 is a schematic cross-sectional view taken along line XIII-XIII shown in FIG. 12.

FIG. 12 is a plan view of the three-phase inverter module according to the second embodiment. FIG. 13 is a schematic cross-sectional view taken along line XIII-XIII shown in FIG. 12. As shown in FIGS. 12 and 13, the three-phase inverter module 1A according to the second embodiment is configured such that the upper phase module 2 and the lower phase module 3 are opposite to each other. Specifically, the three-phase inverter module 1A is transversely disposed so that the upper phase module 2 and the lower phase module 3 are opposite to each other in the Y-direction. Meanwhile, in the second embodiment, the Y-direction described in the first embodiment is an opposite direction between the upper phase module 2 and the lower phase module 3, and is a second direction.

The first electrode terminal 24U and the fourth electrode terminal 34U, the second electrode terminal 24V and the fifth electrode terminal 34V, the third electrode terminal 24W and the sixth electrode terminal 34W, the first P terminal 25P and the first N terminal 35N, and the second P terminal 26P and the second N terminal 36N are located at the same positions, respectively, in the X-direction. The first electrode terminal 24U and the fourth electrode terminal 34U, the second electrode terminal 24V and the fifth electrode terminal 34V, and the third electrode terminal 24W and the sixth electrode terminal 34W are respectively connected to each other.

In this manner, in the three-phase inverter module 1A according to the second embodiment, since the symmetry of each terminal in the upper phase module 2 and the lower phase module 3 can also be secured, the shape of the upper phase mold portion 28 and the shape of the lower phase mold portion 38 can be made to coincide with each other. Thereby, a mold for resin-molding the upper phase module 2 and a mold for resin-molding the lower phase module 3 can be used in common.

The present invention is not limited to the above embodiment.

Figure 14:
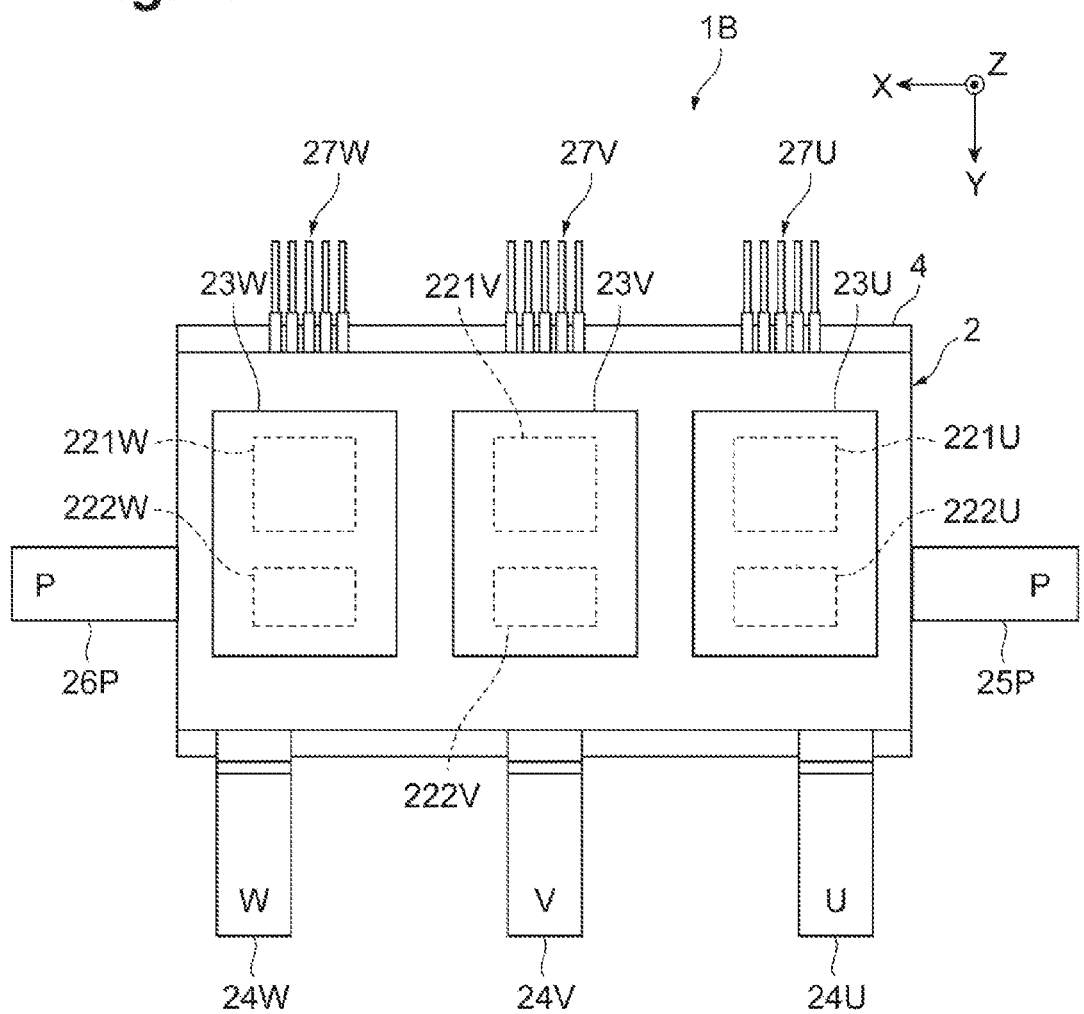
FIG. 14 is a plan view of a three-phase inverter module according to another embodiment.

For example, when the first P terminal and the second P terminal are located so as to be symmetric with respect to the second electrode terminal 24V and the fifth electrode terminal 34V in the X-direction, the first P terminal, the second P terminal, the first N terminal and the second N terminal may be located at any positions. For example, as in a three-phase inverter module 1B shown in FIG. 14, the first P terminal 25P and the second P terminal 26P may be caused to protrude from both lateral sides of the upper phase module 2 in the X-direction, in the X-direction and the opposite direction to the X-direction. In this case, the first P terminal 25P and the second P terminal 26P are located at the same position in the second direction (Y-direction) and the third direction (Z-direction). Meanwhile, since the positions of the first N terminal and the second N terminal in the lower phase module are the same as the positions of the first P terminal and the second P terminal in the upper phase module, the positions of the first P terminal and the second P terminal will not be described.

In addition, in the above-mentioned embodiment, a description has been given on the assumption that the second electrode terminal 24V is set to a central terminal, the first electrode terminal 24U and the third electrode terminal 24W are set to a first outside terminal and a second outside terminal, and the first P terminal 25P and the second P terminal 26P are set to a first inside terminal and a second inside terminal. However, when the central terminal is any one terminal among the first electrode terminal, the second electrode terminal, the third electrode terminal, the first P terminal and the second P terminal, the central terminal may be any terminal. In addition, when the first inside terminal and the second inside terminal are a pair of terminals other than the central terminal among the first electrode terminal, the second electrode terminal, the third electrode terminal, the first P terminal and the second P terminal, these terminals may be any terminals. In addition, when the first outside terminal and the second outside terminal are the remaining pair of terminals among the first electrode terminal, the second electrode terminal, the third electrode terminal, the first P terminal and the second P terminal, these terminals may be any terminals. For example, as in a three-phase inverter module 1C shown in FIGS. 15 and 16, or a three-phase inverter module 1D shown in FIGS. 17 and 18, the first P terminal 25P may be set to a central terminal, the first electrode terminal 24U and the third electrode terminal 24W may be set to a first outside terminal and a second outside terminal, and the second electrode terminal 24V and the second P terminal 26P may be set to a first inside terminal and a second inside terminal.

Figure 15:
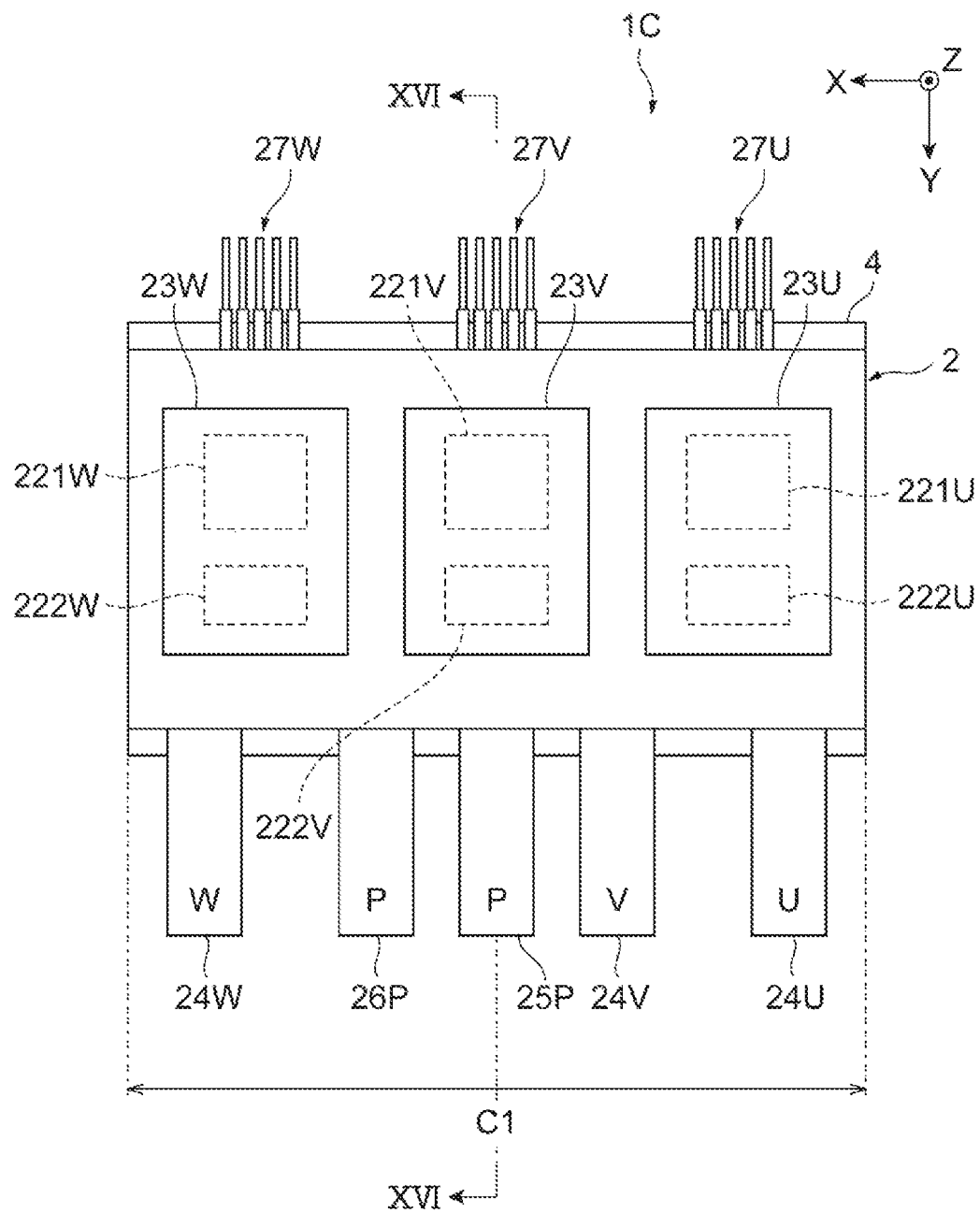
FIG. 15 is a plan view of a three-phase inverter module according to another embodiment.
Figure 16:
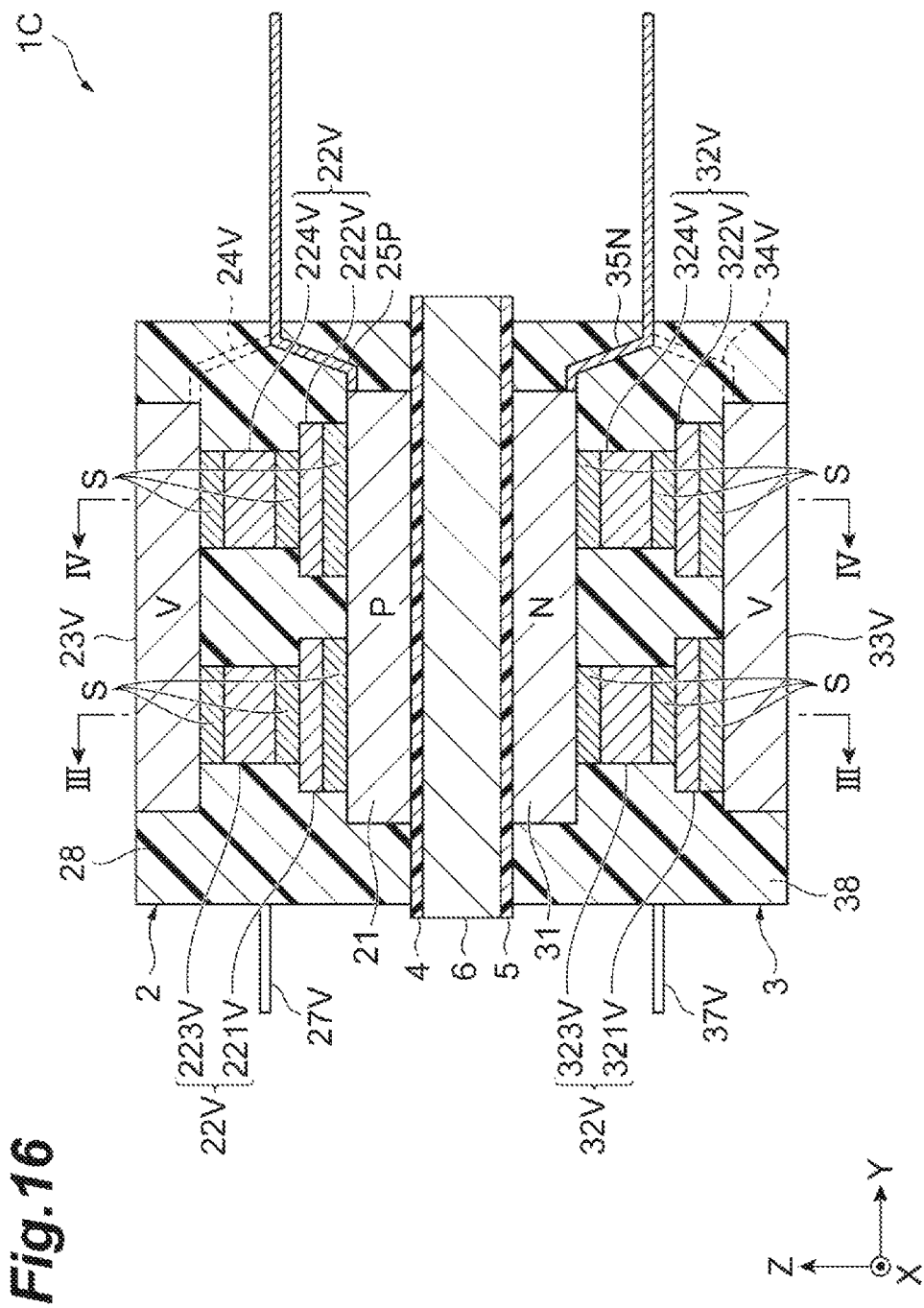
FIG. 16 is a schematic cross-sectional view taken along line XVI-XVI shown in FIG. 15.

The three-phase inverter module 1C shown in FIGS. 15 and 16 is basically the same as the three-phase inverter module 1 according to the first embodiment, but the positional relationships and shapes of the first electrode terminal 24U, the second electrode terminal 24V, the third electrode terminal 24W, the fourth electrode terminal 34U, the fifth electrode terminal 34V, the sixth electrode terminal 34W, the first P terminal 25P, the second P terminal 26P, the first N terminal 35N and the second N terminal 36N are different from those of the three-phase inverter module 1 according to the first embodiment. Specifically, the first P terminal 25P is set to a central terminal, the first electrode terminal 24U and the third electrode terminal 24W are set to a first outside terminal and a second outside terminal, and the second electrode terminal 24V and the second P terminal 26P are set to a first inside terminal and a second inside terminal. The first electrode terminal 24U, the second electrode terminal 24V and the third electrode terminal 24W protrude from the first electrode 23U, the second electrode 23V and the third electrode 23W, respectively, and are inclined to the P electrode 21 side. The first P terminal 25P and the second P terminal 26P protrude from the P electrode 21, and are inclined to the first electrode 23U side, the second electrode 23V side and the third electrode 23W side. The first electrode terminal 24U, the second electrode terminal 24V, the third electrode terminal 24W, the first P terminal 25P and the second P terminal 26P protrude from the upper phase mold portion 28 toward the Y-direction at the same position in the Z-direction. Similarly, the fourth electrode terminal 34U, the fifth electrode terminal 34V and the sixth electrode terminal 34W protrude from the fourth electrode 33U, the fifth electrode 33V and the sixth electrode 33W, respectively, and are inclined to the N electrode 31 side. The first N terminal 35N and the second N terminal 36N protrude from the N electrode 31, and are inclined to the fourth electrode 33U side, the fifth electrode 33V side and the sixth electrode 33W side. The fourth electrode terminal 34U, the fifth electrode terminal 34V, the sixth electrode terminal 34W, the first N terminal 35N and the second N terminal 36N protrude from the lower phase mold portion 38 toward the Y-direction at the same position in the Z-direction.

Figure 17:
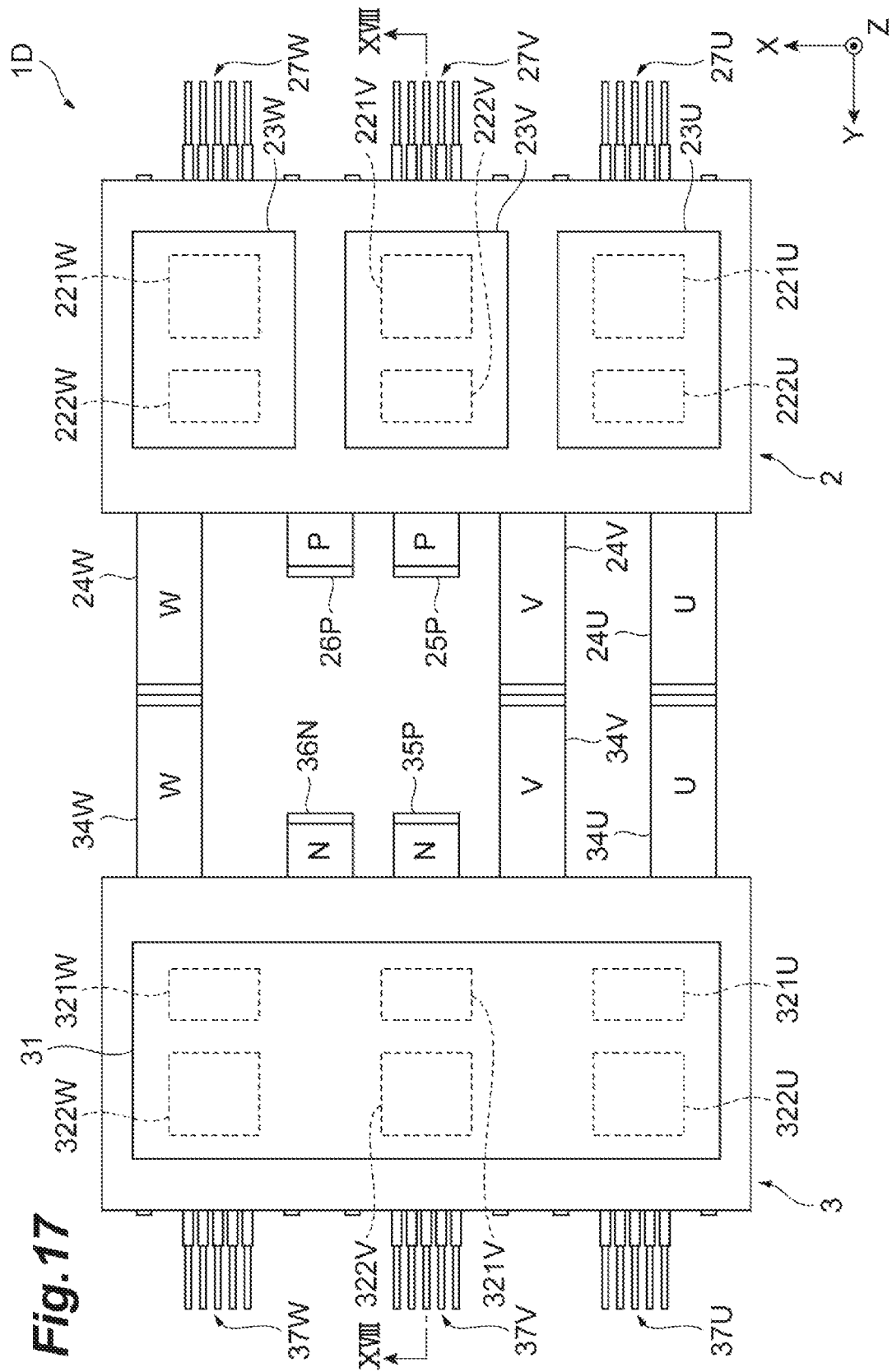
FIG. 17 is a plan view of a three-phase inverter module according to another embodiment.
Figure 18:
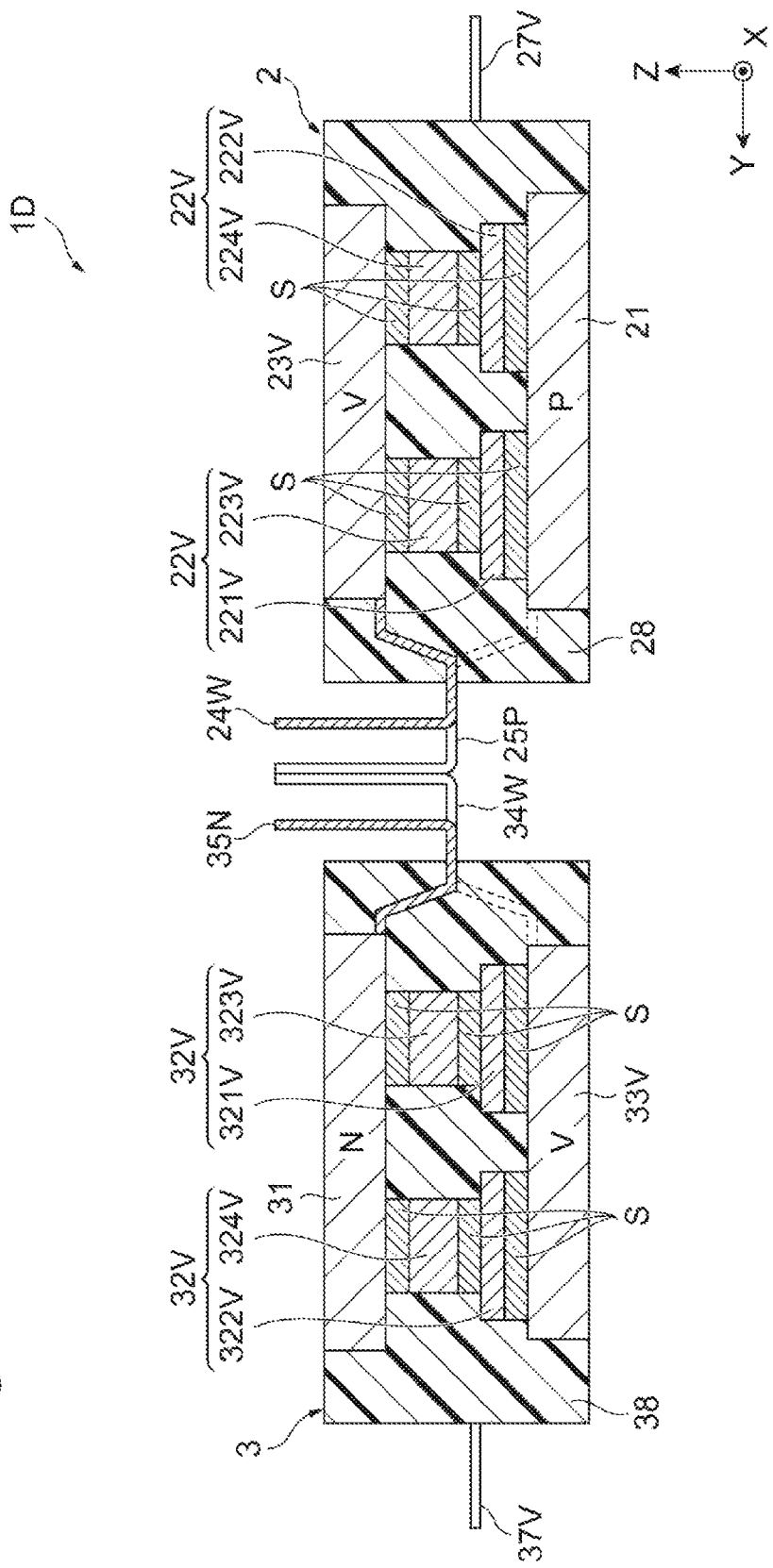
FIG. 18 is a schematic cross-sectional view taken along line XVIII-XVIII shown in FIG. 17.

A three-phase inverter module 1D shown in FIGS. 17 and 18 is basically the same as the three-phase inverter module 1A according to the second embodiment, and the positional relationships of the first electrode terminal 24U, the second electrode terminal 24V, the third electrode terminal 24W, the first P terminal 25P and the second P terminal 26P are the same as the positional relationships in the three-phase inverter module 1C shown in FIGS. 15 and 16. In addition, the shapes of the first electrode terminal 24U, the second electrode terminal 24V, the third electrode terminal 24W, the first P terminal 25P and the second P terminal 26P within the upper phase mold portion 28 and the shapes of the fourth electrode terminal 34U, the fifth electrode terminal 34V, the sixth electrode terminal 34W, the first N terminal 35N and the second N terminal 36N within the lower phase mold portion 38 are the same as those in the three-phase inverter module 1C shown in FIGS. 15 and 16.

In this manner, since the symmetry of each terminal in the upper phase module 2 and the lower phase module 3 can be secured even in a case where each terminal is located at the positions shown in FIGS. 15 and 16 or is located at the positions shown in FIGS. 17 and 18, the shape of the upper phase mold portion 28 and the shape of the lower phase mold portion 38 can be made to coincide with each other. Thereby, a mold for resin-molding the upper phase module 2 and a mold for resin-molding the lower phase module 3 can be used in common.

In addition, in the first embodiment, a description has been given of a case where the upper phase module and the lower phase module are laminated with an insulating portion and a cooler interposed therebetween, but the upper phase module and the lower phase module may be laminated with only the insulating portion interposed therebetween without going through the cooler.

In addition, in the above embodiment, a description has been given of a case where the first signal line 27U, the second signal line 27V and the third signal line 27W protrude from the upper phase mold portion 28, and the fourth signal line 37U, the fifth signal line 37V and the sixth signal line 37W protrude from the lower phase mold portion 38. However, the first signal line 27U, the second signal line 27V and the third signal line 27W may be bundled into one within the upper phase mold portion 28, and the signal lines bundled into one may protrude from the upper phase mold portion 28. Similarly, the fourth signal line 37U, the fifth signal line 37V and the sixth signal line 37W may be bundled into one within the lower phase mold portion 38, and the signal lines bundled into one may protrude from the lower phase mold portion 38. In this case, the protruding positions of these signal lines are set to the center C1 of the upper phase module 2 in the X-direction and the center C2 of the lower phase module 3 in the X-direction, respectively, and are set to the same position in the Z-direction.

The invention claimed is:

1. A three-phase inverter module comprising:
an upper phase module and a lower phase module which are opposite to each other,
wherein the upper phase module includes
a first electrode, a second electrode and a third electrode which are arranged in a first direction perpendicular to an opposite direction between the upper phase module and the lower phase module,
a P electrode which is connected to the first electrode, the second electrode and the third electrode through a first semiconductor device portion, a second semiconductor device portion and a third semiconductor device portion, respectively,
an upper phase mold portion in which the first electrode, the second electrode, the third electrode and the P electrode are formed integrally with each other,
a first electrode terminal that protrudes from the first electrode in a second direction perpendicular to the first direction,
a second electrode terminal that protrudes from the second electrode in the second direction,
a third electrode terminal that protrudes from the third electrode in the second direction, and
a first P terminal and a second P terminal that protrude from the P electrode in the first direction or the second direction,
the lower phase module includes
a fourth electrode, a fifth electrode and a sixth electrode which are arranged in the first direction,
an N electrode which is connected to the fourth electrode, the fifth electrode and the sixth electrode through a fourth semiconductor device portion, a fifth semiconductor device portion and a sixth semiconductor device portion, respectively,
a lower phase mold portion in which the fourth electrode, the fifth electrode, the sixth electrode and the N electrode are formed integrally with each other, and which has the same shape as that of the upper phase mold portion,
a fourth electrode terminal that protrudes from the fourth electrode in the second direction,
a fifth electrode terminal that protrudes from the fifth electrode in the second direction,
a sixth electrode terminal that protrudes from the sixth electrode in the second direction, and
a first N terminal and a second N terminal that protrude from the N electrode in the first direction or the second direction,
the first electrode terminal and the fourth electrode terminal, the second electrode terminal and the fifth electrode terminal, the third electrode terminal and the sixth electrode terminal, the first P terminal and the first N terminal, and the second P terminal and the second N terminal are located at the same positions, respectively, in the first direction,
in the respective terminals included in the upper phase module and the respective terminals included in the lower phase module, one terminal of the respective terminals is a central terminal which is located at a center of the upper phase module or the lower phase module in the first direction, a pair of terminals other than the central terminal are a first inside terminal and a second inside terminal that protrude from positions symmetric with respect to the central terminal in the first direction, and from the same position in a third direction perpendicular to the first direction and the second direction, and a remaining pair of terminals are a first outside terminal and a second outside terminal which are located outside a region between the first inside terminal and the second inside terminal in the first direction, and the first outside terminal and the second outside terminal protrude from positions symmetric with respect to the central terminal in the first direction, and from the same position in the third direction.

2. The three-phase inverter module according to claim 1, wherein the upper phase module and the lower phase module are laminated with an insulating portion interposed therebetween in the opposite direction.

3. The three-phase inverter module according to claim 1, wherein the second electrode terminal is the central terminal, the first electrode terminal and the third electrode terminal protrude from positions symmetric with respect to the second electrode terminal in the first direction, and the first P terminal and the second P terminal protrude from the positions symmetric with respect to the second electrode terminal in the first direction.

4. The three-phase inverter module according to claim 1, wherein the first P terminal and the second P terminal are the first inside terminal and the second inside terminal.

5. The three-phase inverter module according to claim 1, wherein the upper phase module further includes a first signal line, connected to the first semiconductor device portion, which protrudes from the upper phase mold portion in the second direction, a second signal line, connected to the second semiconductor device portion, which protrudes from the upper phase mold portion in the second direction, and a third signal line, connected to the third semiconductor device portion, which protrudes from the upper phase mold portion in the second direction, the lower phase module further includes a fourth signal line, connected to the fourth semiconductor device portion, which protrudes from the lower phase mold portion in the second direction, a fifth signal line, connected to the fifth semiconductor device portion, which protrudes from the lower phase mold portion in the second direction, and a sixth signal line, connected to the sixth semiconductor device portion, which protrudes from the lower phase mold portion in the second direction, the first signal line and the fourth signal line, the second signal line and the fifth signal line, and the third signal line and the sixth signal line are located at the same positions, respectively, in the first direction, the second signal line is located at the center of the upper phase module in the first direction, and the first signal line and the third signal line protrude from positions symmetric with respect to the second signal line in the first direction, and from the same position in the third direction.

* * * * *